(12) United States Patent
Lempkowski et al.

(10) Patent No.: US 7,161,227 B2
(45) Date of Patent: Jan. 9, 2007

(54) STRUCTURE AND METHOD FOR FABRICATING SEMICONDUCTOR STRUCTURES AND DEVICES FOR DETECTING AN OBJECT

(75) Inventors: Robert Lempkowski, Elk Grove, IL (US); Marc Chason, Schaumburg, IL (US)

(73) Assignee: Motorola, Inc., Schaumburg, IL (US)

(*) Notice: Subject to any disclaimer, the term of this patent is extended or adjusted under 35 U.S.C. 154(b) by 116 days.

(21) Appl. No.: 10/878,414

(22) Filed: Jun. 29, 2004

(65) Prior Publication Data

US 2004/0232430 A1    Nov. 25, 2004

Related U.S. Application Data

(63) Continuation of application No. 09/928,356, filed on Aug. 14, 2001, now abandoned.

(51) Int. Cl.
    *H01L 29/00* (2006.01)

(52) U.S. Cl. ............ 257/531; 257/684; 257/528; 257/428; 257/E27.001; 257/E21.022; 257/E27.04

(58) Field of Classification Search .......... None
    See application file for complete search history.

(56) References Cited

U.S. PATENT DOCUMENTS

| | | | |
|---|---|---|---|
| 3,617,951 A | 11/1971 | Anderson | |
| 3,670,213 A | 6/1972 | Nakawaga et al. | |
| 3,758,199 A | 9/1973 | Thaxter | |
| 3,766,370 A | 10/1973 | Walther | |
| 3,802,967 A | 4/1974 | Ladany et al. | |
| 3,818,451 A | 6/1974 | Coleman | |
| 3,914,137 A | 10/1975 | Huffman et al. | |
| 3,935,031 A | 1/1976 | Adler | |
| 4,006,989 A | 2/1977 | Andringa | |
| 4,084,130 A | 4/1978 | Holton | |

(Continued)

FOREIGN PATENT DOCUMENTS

DE    196 07 107    8/1997

(Continued)

OTHER PUBLICATIONS

Yi W. et al; "Mechanism of cleaning SI (100) surface using Sr and SrO for the growth of crystalline SrTiO/sub 2/films" Journal of Vacuum Science & Technology, vol. 20, No. 4, Jul. 2002 pp. 1402-1405.

(Continued)

*Primary Examiner*—Evan Pert
*Assistant Examiner*—Victor A. Mandala, Jr.

(57) ABSTRACT

High quality epitaxial layers of monocrystalline materials can be grown overlying monocrystalline substrates such as large silicon wafers by forming a compliant substrate for growing the monocrystalline layers. An accommodating buffer layer comprises a layer of monocrystalline oxide spaced apart from a silicon wafer by an amorphous interface layer of silicon oxide. The amorphous interface layer dissipates strain and permits the growth of a high quality monocrystalline oxide accommodating buffer layer. The accommodating buffer layer is lattice matched to both the underlying silicon wafer and the overlying monocrystalline material layer. Any lattice mismatch between the accommodating buffer layer and the underlying silicon substrate is taken care of by the amorphous interface layer. In addition, formation of a compliant substrate may include utilizing surfactant enhanced epitaxy, epitaxial growth of single crystal silicon onto single crystal oxide, and epitaxial growth of Zintl phase materials. A high quality layer of compound semiconductor material is used to form a source component and a receiver component that are interconnected with an antenna and each other within a semiconductor structure that can detect a parameter, such as the speed, of an object.

18 Claims, 14 Drawing Sheets

U.S. PATENT DOCUMENTS

| | | |
|---|---|---|
| 4,120,588 A | 10/1978 | Chaum |
| 4,146,297 A | 3/1979 | Alferness et al. |
| 4,174,422 A | 11/1979 | Matthews et al. |
| 4,174,504 A | 11/1979 | Chenausky et al. |
| 4,177,094 A | 12/1979 | Kroon |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,298,247 A | 11/1981 | Michelet et al. |
| 4,378,259 A | 3/1983 | Hasegawa et al. |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 6/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer et al. |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,064,781 A | 11/1991 | Cambou et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,679 A | 6/1992 | Ishii et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,238,877 A | 8/1993 | Russell |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |

| | | | | | | |
|---|---|---|---|---|---|---|
| 5,313,058 A | 5/1994 | Friederich et al. | | 5,528,067 A | 6/1996 | Farb |
| 5,314,547 A | 5/1994 | Heremans et al. | | 5,528,209 A | 6/1996 | Macdonald et al. |
| 5,315,128 A | 5/1994 | Hunt et al. | | 5,528,414 A | 6/1996 | Oakley |
| 5,323,023 A | 6/1994 | Fork | | 5,530,235 A | 6/1996 | Stefik et al. |
| 5,326,721 A | 7/1994 | Summerfelt | | 5,538,941 A | 7/1996 | Findikoglu et al. |
| 5,334,556 A | 8/1994 | Guldi | | 5,540,785 A | 7/1996 | Dennard et al. |
| 5,352,926 A | 10/1994 | Andrews | | 5,541,422 A | 7/1996 | Wolf et al. |
| 5,356,509 A | 10/1994 | Terranova et al. | | 5,548,141 A | 8/1996 | Morris et al. |
| 5,356,831 A | 10/1994 | Calviello et al. | | 5,549,977 A | 8/1996 | Jin et al. |
| 5,357,122 A | 10/1994 | Okubora et al. | | 5,551,238 A | 9/1996 | Prueitt |
| 5,358,925 A | 10/1994 | Neville Connell et al. | | 5,552,547 A | 9/1996 | Shi |
| 5,362,972 A | 11/1994 | Yazawa et al. | | 5,553,089 A | 9/1996 | Seki et al. |
| 5,362,998 A | 11/1994 | Iwamura et al. | | 5,556,463 A | 9/1996 | Guenzer |
| 5,365,477 A | 11/1994 | Cooper, Jr. et al. | | 5,559,368 A | 9/1996 | Hu et al. |
| 5,371,621 A | 12/1994 | Stevens | | 5,561,305 A | 10/1996 | Smith |
| 5,371,734 A | 12/1994 | Fischer | | 5,569,953 A | 10/1996 | Kikkawa et al. |
| 5,372,992 A | 12/1994 | Itozaki et al. | | 5,570,226 A | 10/1996 | Ota |
| 5,373,166 A | 12/1994 | Buchan et al. | | 5,572,052 A | 11/1996 | Kashihara et al. |
| 5,387,811 A | 2/1995 | Saigoh | | 5,574,296 A | 11/1996 | Park et al. |
| 5,391,515 A | 2/1995 | Kao et al. | | 5,574,589 A | 11/1996 | Feuer et al. |
| 5,393,352 A | 2/1995 | Summerfelt | | 5,574,744 A | 11/1996 | Gaw et al. |
| 5,394,489 A | 2/1995 | Koch | | 5,576,879 A | 11/1996 | Nashimoto |
| 5,395,663 A | 3/1995 | Tabata et al. | | 5,578,162 A | 11/1996 | D'Asaro et al. |
| 5,397,428 A | 3/1995 | Stoner et al. | | 5,585,167 A | 12/1996 | Satoh et al. |
| 5,399,898 A | 3/1995 | Rostoker | | 5,585,288 A | 12/1996 | Davis et al. |
| 5,404,581 A | 4/1995 | Honjo | | 5,588,995 A | 12/1996 | Sheldon |
| 5,405,802 A | 4/1995 | Yamagata et al. | | 5,589,284 A | 12/1996 | Summerfelt et al. |
| 5,406,202 A | 4/1995 | Mehrgardt et al. | | 5,596,205 A | 1/1997 | Reedy et al. |
| 5,410,622 A | 4/1995 | Okada et al. | | 5,596,214 A | 1/1997 | Endo |
| 5,418,216 A | 5/1995 | Fork | | 5,602,418 A | 2/1997 | Imai et al. |
| 5,418,389 A | 5/1995 | Watanabe | | 5,603,764 A | 2/1997 | Matsuda et al. |
| 5,420,102 A | 5/1995 | Harshavardhan et al. | | 5,606,184 A | 2/1997 | Abrokwah et al. |
| 5,427,988 A | 6/1995 | Sengupta et al. | | 5,608,046 A | 3/1997 | Cook et al. |
| 5,430,397 A | 7/1995 | Itoh et al. | | 5,610,744 A | 3/1997 | Ho et al. |
| 5,436,759 A | 7/1995 | Dijaili et al. | | 5,614,739 A | 3/1997 | Abrokwah et al. |
| 5,438,584 A | 8/1995 | Paoli et al. | | 5,619,051 A | 4/1997 | Endo |
| 5,441,577 A | 8/1995 | Sasaki et al. | | 5,621,227 A | 4/1997 | Joshi |
| 5,442,191 A | 8/1995 | Ma | | 5,623,439 A | 4/1997 | Gotoh et al. |
| 5,442,561 A | 8/1995 | Yoshizawa et al. | | 5,623,552 A | 4/1997 | Lane |
| 5,444,016 A | 8/1995 | Abrokwah et al. | | 5,629,534 A | 5/1997 | Inuzuka et al. |
| 5,446,719 A | 8/1995 | Yoshida et al. | | 5,633,724 A | 5/1997 | King et al. |
| 5,450,812 A | 9/1995 | McKee et al. | | 5,635,433 A | 6/1997 | Sengupta |
| 5,452,118 A | 9/1995 | Maruska | | 5,635,453 A | 6/1997 | Pique et al. |
| 5,453,727 A | 9/1995 | Shibasaki et al. | | 5,640,267 A | 6/1997 | May et al. |
| 5,466,631 A | 11/1995 | Ichikawa et al. | | 5,642,371 A | 6/1997 | Tohyama et al. |
| 5,473,047 A | 12/1995 | Shi | | 5,650,646 A | 7/1997 | Summerfelt |
| 5,473,171 A | 12/1995 | Summerfelt | | 5,656,382 A | 8/1997 | Nashimoto |
| 5,477,363 A | 12/1995 | Matsuda | | 5,659,180 A | 8/1997 | Shen et al. |
| 5,478,653 A | 12/1995 | Guenzer | | 5,661,112 A | 8/1997 | Hatta et al. |
| 5,479,033 A | 12/1995 | Baca et al. | | 5,666,376 A | 9/1997 | Cheng |
| 5,479,317 A | 12/1995 | Ramesh | | 5,667,586 A | 9/1997 | Ek et al. |
| 5,480,829 A | 1/1996 | Abrokwah et al. | | 5,668,048 A | 9/1997 | Kondo et al. |
| 5,481,102 A | 1/1996 | Hazelrigg, Jr. | | 5,670,798 A | 9/1997 | Schetzina |
| 5,482,003 A | 1/1996 | McKee et al. | | 5,670,800 A | 9/1997 | Nakao et al. |
| 5,484,664 A | 1/1996 | Kitahara et al. | | 5,674,366 A | 10/1997 | Hayashi et al. |
| 5,486,406 A | 1/1996 | Shi | | 5,674,813 A | 10/1997 | Nakamura et al. |
| 5,491,461 A | 2/1996 | Partin et al. | | 5,679,947 A | 10/1997 | Doi et al. |
| 5,492,859 A | 2/1996 | Sakaguchi et al. | | 5,679,965 A | 10/1997 | Schetzina |
| 5,494,711 A | 2/1996 | Takeda et al. | | 5,682,046 A | 10/1997 | Takahashi et al. |
| 5,504,035 A | 4/1996 | Rostoker et al. | | 5,684,302 A | 11/1997 | Wersing et al. |
| 5,504,183 A | 4/1996 | Shi et al. | | 5,686,741 A | 11/1997 | Ohori et al. |
| 5,508,554 A | 4/1996 | Takatani et al. | | 5,689,123 A | 11/1997 | Major et al. |
| 5,510,665 A | 4/1996 | Conley | | 5,693,140 A | 12/1997 | McKee et al. |
| 5,511,238 A | 4/1996 | Bayraktaroglu | | 5,696,392 A | 12/1997 | Char et al. |
| 5,512,773 A | 4/1996 | Wolf et al. | | 5,719,417 A | 2/1998 | Roeder et al. |
| 5,514,484 A | 5/1996 | Nashimoto | | 5,725,641 A | 3/1998 | MacLeod |
| 5,514,904 A | 5/1996 | Onga et al. | | 5,729,394 A | 3/1998 | Sevier et al. |
| 5,515,047 A | 5/1996 | Yamakido et al. | | 5,729,641 A | 3/1998 | Chandonnet et al. |
| 5,515,810 A | 5/1996 | Yamashita et al. | | 5,731,220 A | 3/1998 | Tsu et al. |
| 5,516,725 A | 5/1996 | Chang et al. | | 5,733,641 A | 3/1998 | Fork et al. |
| 5,519,235 A | 5/1996 | Ramesh | | 5,734,672 A | 3/1998 | McMinn et al. |
| 5,523,602 A | 6/1996 | Horiuchi et al. | | 5,735,949 A | 4/1998 | Mantl et al. |
| 5,528,057 A | 6/1996 | Yanagase et al. | | 5,741,724 A | 4/1998 | Ramdani et al. |

| | | | | | | |
|---|---|---|---|---|---|---|
| 5,745,631 A | 4/1998 | Reinker | | 5,937,285 A | 8/1999 | Abrokwah et al. |
| 5,753,300 A | 5/1998 | Wessels et al. | | 5,948,161 A | 9/1999 | Kizuki |
| 5,753,928 A | 5/1998 | Krause | | 5,953,468 A | 9/1999 | Finnila et al. |
| 5,753,934 A | 5/1998 | Yano et al. | | 5,955,591 A | 9/1999 | Imbach et al. |
| 5,754,319 A | 5/1998 | Van De Voorde et al. | | 5,959,308 A | 9/1999 | Shichijo et al. |
| 5,754,714 A | 5/1998 | Suzuki et al. | | 5,959,879 A | 9/1999 | Koo |
| 5,760,426 A | 6/1998 | Marx et al. | | 5,962,069 A | 10/1999 | Schindler et al. |
| 5,760,427 A | 6/1998 | Onda | | 5,963,291 A | 10/1999 | Wu et al. |
| 5,760,740 A | 6/1998 | Blodgett | | 5,966,323 A | 10/1999 | Chen et al. |
| 5,764,676 A | 6/1998 | Paoli et al. | | 5,976,953 A | 11/1999 | Zavracky et al. |
| 5,767,543 A | 6/1998 | Ooms et al. | | 5,977,567 A | 11/1999 | Verdiell |
| 5,770,887 A | 6/1998 | Tadatomo et al. | | 5,981,400 A | 11/1999 | Lo |
| 5,772,758 A | 6/1998 | Collins et al. | | 5,981,976 A | 11/1999 | Murasato |
| 5,776,359 A | 7/1998 | Schultz et al. | | 5,981,980 A | 11/1999 | Miyajima et al. |
| 5,776,621 A | 7/1998 | Nashimoto | | 5,984,190 A | 11/1999 | Nevill |
| 5,777,350 A | 7/1998 | Nakamura et al. | | 5,985,404 A | 11/1999 | Yano et al. |
| 5,777,762 A | 7/1998 | Yamamoto | | 5,986,301 A | 11/1999 | Fukushima et al. |
| 5,778,018 A | 7/1998 | Yoshikawa et al. | | 5,987,011 A | 11/1999 | Toh |
| 5,778,116 A | 7/1998 | Tomich | | 5,987,196 A | 11/1999 | Noble |
| 5,780,311 A | 7/1998 | Beasom et al. | | 5,990,495 A | 11/1999 | Ohba |
| 5,789,733 A | 8/1998 | Jachimowicz et al. | | 5,995,359 A | 11/1999 | Klee et al. |
| 5,789,845 A | 8/1998 | Wadaka et al. | | 5,995,528 A | 11/1999 | Fukunaga et al. |
| 5,790,583 A | 8/1998 | Ho | | 5,997,638 A | 12/1999 | Copel et al. |
| 5,792,569 A | 8/1998 | Sun et al. | | 5,998,781 A | 12/1999 | Vawter et al. |
| 5,792,679 A | 8/1998 | Nakato | | 5,998,819 A | 12/1999 | Yokoyama et al. |
| 5,796,648 A | 8/1998 | Kawakubo et al. | | 6,002,375 A | 12/1999 | Corman et al. |
| 5,801,072 A | 9/1998 | Barber | | 6,008,762 A | 12/1999 | Nghiem |
| 5,801,105 A | 9/1998 | Yano et al. | | 6,011,641 A | 1/2000 | Shin et al. |
| 5,807,440 A | 9/1998 | Kubota et al. | | 6,011,646 A | 1/2000 | Mirkarimi et al. |
| 5,810,923 A | 9/1998 | Yano et al. | | 6,013,553 A | 1/2000 | Wallace et al. |
| 5,812,272 A | 9/1998 | King et al. | | 6,020,222 A | 2/2000 | Wollesen |
| 5,814,583 A | 9/1998 | Itozaki et al. | | 6,022,140 A | 2/2000 | Fraden et al. |
| 5,825,055 A | 10/1998 | Summerfelt | | 6,022,410 A | 2/2000 | Yu et al. |
| 5,825,799 A | 10/1998 | Ho et al. | | 6,022,671 A | 2/2000 | Binkley et al. |
| 5,827,755 A | 10/1998 | Yonehara et al. | | 6,022,963 A | 2/2000 | McGall et al. |
| 5,828,080 A | 10/1998 | Yano et al. | | 6,023,082 A | 2/2000 | McKee et al. |
| 5,830,270 A | 11/1998 | McKee et al. | | 6,028,853 A | 2/2000 | Haartsen |
| 5,831,960 A | 11/1998 | Jiang et al. | | 6,039,803 A | 3/2000 | Fitzgerald et al. |
| 5,833,603 A | 11/1998 | Kovacs et al. | | 6,045,626 A | 4/2000 | Yano et al. |
| 5,834,362 A | 11/1998 | Miyagaki et al. | | 6,046,464 A | 4/2000 | Schetzina |
| 5,838,035 A | 11/1998 | Ramesh | | 6,048,751 A | 4/2000 | D'Asaro et al. |
| 5,838,053 A | 11/1998 | Bevan et al. | | 6,049,110 A | 4/2000 | Koh |
| 5,844,260 A | 12/1998 | Ohori | | 6,049,702 A | 4/2000 | Tham et al. |
| 5,846,846 A | 12/1998 | Suh et al. | | 6,051,858 A | 4/2000 | Uchida et al. |
| 5,852,687 A | 12/1998 | Wickham | | 6,051,874 A | 4/2000 | Masuda |
| 5,857,049 A | 1/1999 | Beranek et al. | | 6,055,179 A | 4/2000 | Koganei et al. |
| 5,858,814 A | 1/1999 | Goossen et al. | | 6,058,131 A | 5/2000 | Pan |
| 5,861,966 A | 1/1999 | Ortel | | 6,059,895 A | 5/2000 | Chu et al. |
| 5,863,326 A | 1/1999 | Nause et al. | | 6,064,078 A | 5/2000 | Northrup et al. |
| 5,864,171 A | 1/1999 | Yamamoto et al. | | 6,064,092 A | 5/2000 | Park |
| 5,869,845 A | 2/1999 | Vander Wagt et al. | | 6,064,783 A | 5/2000 | Congdon et al. |
| 5,872,493 A | 2/1999 | Ella | | 6,078,717 A | 6/2000 | Nashimoto et al. |
| 5,873,977 A | 2/1999 | Desu et al. | | 6,080,378 A | 6/2000 | Yokota et al. |
| 5,874,860 A | 2/1999 | Brunel et al. | | 6,083,697 A | 7/2000 | Beecher et al. |
| 5,878,175 A | 3/1999 | Sonoda et al. | | 6,087,681 A | 7/2000 | Shakuda |
| 5,879,956 A | 3/1999 | Seon et al. | | 6,088,216 A | 7/2000 | Laibowitz et al. |
| 5,880,452 A | 3/1999 | Plesko | | 6,090,659 A | 7/2000 | Laibowitz et al. |
| 5,882,948 A | 3/1999 | Jewell | | 6,093,302 A | 7/2000 | Montgomery |
| 5,883,564 A | 3/1999 | Partin | | 6,096,584 A | 8/2000 | Ellis-Monaghan et al. |
| 5,883,996 A | 3/1999 | Knapp et al. | | 6,100,578 A | 8/2000 | Suzuki |
| 5,886,867 A | 3/1999 | Chivukula et al. | | 6,103,008 A | 8/2000 | McKee et al. |
| 5,888,296 A | 3/1999 | Ooms et al. | | 6,103,403 A | 8/2000 | Grigorian et al. |
| 5,889,296 A | 3/1999 | Imamura et al. | | 6,107,653 A | 8/2000 | Fitzgerald |
| 5,896,476 A | 4/1999 | Wisseman et al. | | 6,107,721 A | 8/2000 | Lakin |
| 5,905,571 A | 5/1999 | Butler et al. | | 6,108,125 A | 8/2000 | Yano |
| 5,907,792 A | 5/1999 | Droopad et al. | | 6,110,813 A | 8/2000 | Ota et al. |
| 5,912,068 A | 6/1999 | Jia | | 6,110,840 A | 8/2000 | Yu |
| 5,919,515 A | 7/1999 | Yano et al. | | 6,113,225 A | 9/2000 | Miyata et al. |
| 5,919,522 A | 7/1999 | Baum et al. | | 6,113,690 A | 9/2000 | Yu et al. |
| 5,926,493 A | 7/1999 | O'Brien et al. | | 6,114,996 A | 9/2000 | Nghiem |
| 5,926,496 A | 7/1999 | Ho et al. | | 6,121,642 A | 9/2000 | Newns |
| 5,937,115 A | 8/1999 | Domash | | 6,121,647 A | 9/2000 | Yano et al. |
| 5,937,274 A | 8/1999 | Kondow et al. | | 6,128,178 A | 10/2000 | Newns |

| | | |
|---|---|---|
| 6,134,114 A | 10/2000 | Ungermann et al. |
| 6,136,666 A | 10/2000 | So |
| 6,137,603 A | 10/2000 | Henmi |
| 6,139,483 A | 10/2000 | Seabaugh et al. |
| 6,140,746 A | 10/2000 | Miyashita et al. |
| 6,143,072 A | 11/2000 | McKee et al. |
| 6,143,366 A | 11/2000 | Lu |
| 6,146,906 A | 11/2000 | Inoue et al. |
| 6,150,239 A | 11/2000 | Goesele et al. |
| 6,151,240 A | 11/2000 | Suzuki |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,806 B1 | 5/2001 | Woeste et al. |
| 6,232,910 B1 | 5/2001 | Bell et al. |
| 6,233,435 B1 | 5/2001 | Wong |
| 6,235,145 B1 | 5/2001 | Li et al. |
| 6,235,649 B1 | 5/2001 | Kawahara et al. |
| 6,238,946 B1 | 5/2001 | Ziegler |
| 6,239,012 B1 | 5/2001 | Kinsman |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 | 10/2001 | Nashimoto et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,326,667 B1 | 12/2001 | Sugiyama et al. |
| 6,329,277 B1 | 12/2001 | Liu et al. |
| 6,338,756 B1 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B1 | 4/2002 | Ackley |
| 6,372,356 B1 | 4/2002 | Thornton et al. |
| 6,372,813 B1 | 4/2002 | Johnson et al. |
| 6,376,337 B1 | 4/2002 | Wang et al. |
| 6,389,209 B1 | 5/2002 | Suhir |
| 6,391,674 B1 | 5/2002 | Ziegler |
| 6,392,253 B1 | 5/2002 | Saxena |
| 6,392,257 B1 * | 5/2002 | Ramdani et al. ............ 257/190 |
| 6,393,167 B1 | 5/2002 | Davis et al. |
| 6,404,027 B1 | 6/2002 | Hong et al. |
| 6,410,941 B1 | 6/2002 | Taylor et al. |
| 6,410,947 B1 | 6/2002 | Wada |
| 6,411,756 B1 | 6/2002 | Sadot et al. |
| 6,415,140 B1 | 7/2002 | Benjamin et al. |
| 6,417,059 B1 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B1 | 9/2002 | Abeles |
| 6,452,232 B1 | 9/2002 | Adan |
| 6,461,927 B1 | 10/2002 | Mochizuki et al. |
| 6,462,360 B1 * | 10/2002 | Higgins et al. ............. 257/189 |
| 6,477,285 B1 | 11/2002 | Shanley |
| 6,487,100 B1 * | 11/2002 | Watanabe et al. ........... 363/127 |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B1 | 2/2003 | Gan et al. |
| 6,528,374 B1 | 3/2003 | Bojarczuk, Jr. et al. |
| 6,532,806 B1 * | 3/2003 | Xiang et al. .................. 73/105 |
| 6,538,359 B1 | 3/2003 | Hiraku et al. |
| 6,589,887 B1 | 7/2003 | Dalton et al. |
| 6,713,375 B1 * | 3/2004 | Shenoy ....................... 438/612 |
| 2001/0013313 A1 | 8/2001 | Droopad et al. |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0006245 A1 | 1/2002 | Kubota et al. |
| 2002/0008234 A1 | 1/2002 | Emrick |
| 2002/0021855 A1 | 2/2002 | Kim |
| 2002/0030246 A1 | 3/2002 | Eisenbeiser et al. |
| 2002/0047123 A1 | 4/2002 | Ramdani et al. |
| 2002/0047143 A1 | 4/2002 | Ramdani et al. |
| 2002/0052061 A1 | 5/2002 | Fitzgerald |
| 2002/0072245 A1 | 6/2002 | Ooms et al. |
| 2002/0076878 A1 | 6/2002 | Wasa et al. |
| 2002/0079576 A1 | 6/2002 | Seshan |
| 2002/0131675 A1 | 9/2002 | Litvin |
| 2002/0140012 A1 | 10/2002 | Droopad |
| 2002/0145168 A1 | 10/2002 | Bojarczuk, Jr. et al. |
| 2002/0179000 A1 | 12/2002 | Lee et al. |
| 2002/0182762 A1 * | 12/2002 | Powell ......................... 438/22 |
| 2002/0195610 A1 | 12/2002 | Klosowiak |
| 2003/0001189 A1 * | 1/2003 | Fujiwara et al. ............ 257/303 |
| 2003/0015707 A1 * | 1/2003 | Bosco et al. .................. 257/73 |
| 2003/0112576 A1 * | 6/2003 | Brewer et al. ............... 361/119 |

| | | |
|---|---|---|
| 2005/0003606 A1 * | 1/2005 | Tilmans et al. ............. 438/238 |

FOREIGN PATENT DOCUMENTS

| | | |
|---|---|---|
| DE | 197 12 496 | 10/1997 |
| DE | 198 29 609 | 1/2000 |
| DE | 100 17 137 | 10/2000 |
| EP | 0 247 722 | 12/1987 |
| EP | 0 250 171 | 12/1987 |
| EP | 0 300 499 | 1/1989 |
| EP | 0 309 270 | 3/1989 |
| EP | 0 331 338 | 9/1989 |
| EP | 0 331 467 | 9/1989 |
| EP | 0 342 937 | 11/1989 |
| EP | 0 392 714 | 10/1990 |
| EP | 0 412 002 | 2/1991 |
| EP | 0 455 526 | 6/1991 |
| EP | 0 483 993 | 5/1992 |
| EP | 0 494 514 | 7/1992 |
| EP | 0 514 018 | 11/1992 |
| EP | 0 538 611 | 4/1993 |
| EP | 0 581 239 | 2/1994 |
| EP | 0 600 658 | 6/1994 |
| EP | 0 602 568 | 6/1994 |
| EP | 0 607 435 | 7/1994 |
| EP | 0 614 256 | 9/1994 |
| EP | 0 619 283 | 10/1994 |
| EP | 0 630 057 | 12/1994 |
| EP | 0 661 561 | 7/1995 |
| EP | 0 662 266 | 11/1995 |
| EP | 0 711 853 | 5/1996 |
| EP | 0 860 913 | 8/1996 |
| EP | 0 766 292 | 4/1997 |
| EP | 0 777 379 | 6/1997 |
| EP | 0 810 666 | 12/1997 |
| EP | 0 828 287 | 3/1998 |
| EP | 0 852 416 | 7/1998 |
| EP | 0 875 922 | 11/1998 |
| EP | 0 881 669 | 12/1998 |
| EP | 0 884 767 | 12/1998 |
| EP | 0 926 739 | 6/1999 |
| EP | 0 957 522 | 11/1999 |
| EP | 0 964 259 | 12/1999 |
| EP | 0 964 453 | 12/1999 |
| EP | 0 993 017 | 4/2000 |
| EP | 0 999 600 | 5/2000 |
| EP | 1 001 468 | 5/2000 |
| EP | 1 035 759 | 9/2000 |
| EP | 1 037 272 | 9/2000 |
| EP | 1 043 426 | 10/2000 |
| EP | 1 043 427 | 10/2000 |
| EP | 1 043 765 | 10/2000 |
| EP | 1 054 442 | 11/2000 |
| EP | 1 069 605 | 1/2001 |
| EP | 1 069 606 | 1/2001 |
| EP | 1 085 319 | 3/2001 |
| EP | 1 089 338 | 4/2001 |
| EP | 1 109 212 | 6/2001 |
| EP | 1 176 230 | 1/2002 |
| FR | 2 779 843 | 12/1999 |
| GB | 1 319 311 | 6/1970 |
| GB | 2 152 315 | 7/1985 |
| GB | 2 335 792 | 9/1999 |
| JP | 52-88354 | 7/1977 |
| JP | 52-89070 | 7/1977 |
| JP | 52-135684 | 11/1977 |
| JP | 54-134554 | 10/1979 |
| JP | 55-87424 | 7/1980 |
| JP | 58-075868 | 5/1983 |
| JP | 58-213412 | 12/1983 |
| JP | 59-044004 | 3/1984 |
| JP | 59-073498 | 4/1984 |
| JP | 59066183 | 4/1984 |
| JP | 60-161635 | 8/1985 |
| JP | 60-210018 | 10/1985 |
| JP | 60-212018 | 10/1985 |
| JP | 61-36981 | 2/1986 |
| JP | 61-63015 | 4/1986 |
| JP | 61-108187 | 5/1986 |
| JP | 62-245205 | 10/1987 |
| JP | 63-34994 | 2/1988 |
| JP | 63-131104 | 6/1988 |
| JP | 63-198365 | 8/1988 |
| JP | 63-289812 | 11/1988 |
| JP | 64-50575 | 2/1989 |
| JP | 6452329 | 2/1989 |
| JP | 1-102435 | 4/1989 |
| JP | 1-179411 | 7/1989 |
| JP | 01-196809 | 8/1989 |
| JP | 03-149882 | 11/1989 |
| JP | HEI 2-391 | 1/1990 |
| JP | 02051220 | 2/1990 |
| JP | 3-41783 | 2/1991 |
| JP | 03046384 | 2/1991 |
| JP | 3-171617 | 7/1991 |
| JP | 03-188619 | 8/1991 |
| JP | 5-48072 | 2/1993 |
| JP | 5-086477 | 4/1993 |
| JP | 5-152529 | 6/1993 |
| JP | 05150143 | 6/1993 |
| JP | 05 221800 | 8/1993 |
| JP | 5-232307 | 9/1993 |
| JP | 5-238894 | 9/1993 |
| JP | 5-243525 | 9/1993 |
| JP | 5-291299 | 11/1993 |
| JP | 06-069490 | 3/1994 |
| JP | 6-232126 | 8/1994 |
| JP | 6-291299 | 10/1994 |
| JP | 6-334168 | 12/1994 |
| JP | 0 812494 | 1/1996 |
| JP | 9-67193 | 3/1997 |
| JP | 9-82913 | 3/1997 |
| JP | 10-256154 | 9/1998 |
| JP | 10-269842 | 10/1998 |
| JP | 10-303396 | 11/1998 |
| JP | 10-321943 | 12/1998 |
| JP | 11135614 | 5/1999 |
| JP | 11-238683 | 8/1999 |
| JP | 11-260835 | 9/1999 |
| JP | 01 294594 | 11/1999 |
| JP | 11340542 | 12/1999 |
| JP | 2000-06846 | 3/2000 |
| JP | 2 000 1645 | 6/2000 |
| JP | 2000-278085 | 10/2000 |
| JP | 2000-349278 | 12/2000 |
| JP | 2000-351692 | 12/2000 |
| JP | 2001-196892 | 7/2001 |
| JP | 2002-9366 | 1/2002 |
| WO | WO 92/10875 | 6/1992 |
| WO | WO 93/07647 | 4/1993 |
| WO | WO 94/03908 | 2/1994 |
| WO | WO 95/02904 | 1/1995 |
| WO | WO 97/45827 | 12/1997 |
| WO | WO 98/05807 | 1/1998 |
| WO | WO 98/20606 | 5/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 99/67882 | 12/1999 |
| WO | WO 00/06812 | 2/2000 |
| WO | WO 00/16378 | 3/2000 |
| WO | WO 00/33363 | 6/2000 |
| WO | WO 00/48239 | 8/2000 |
| WO | WO 01/04943 A1 | 1/2001 |
| WO | WO 01/16395 | 3/2001 |

| | | |
|---|---|---|
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 01/59821 A1 | 8/2001 |
| WO | WO 01/59837 | 8/2001 |
| WO | WO 02 01648 | 1/2002 |
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/009150 | 1/2002 |
| WO | WO 02/09160 A2 | 1/2002 |
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Xiaming Hu et al; "Sr/Si template formation for the epitaxial growth of SrTiO/sub 3/on Silicon" Materials Research Society Proceedings, vol. 716, 2002, pp. 261-266.

Nakagawara et al., Effects of Buffer Layers in Epitaxial Growth of $SrTiO_3$ Thin Film on Si(100), *J. Appl. Phys.*, 78 (12), Dec. 15, 1995, pp. 7226-7230.

Suzuki et al., "A Proposal of Epitaxial Oxide Thin Film Structures For Future Oxide Electronics," *Materials Science and Engineering B41*, (1996), pp. 166-173.

W. F. Egelhoff et al., "Optimizing GMR Spin Valves: The Outlook for Improved Properties", *1998 Intl Non Volatile Memory Technology Conference*, pp. 34-37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in GaAs/$LiNbO_3$ Structures", *Applied Physics Letters*, vol. 75(7), Aug. 16, 1999, pp. 965-967.

K. Sreenivas et al., "Surface Acoustic Wave Propagation on Lead Zirconate Titanate Thin Films," *Appl. Phys. Lett.* 52 (9), Feb. 29, 1998, pp. 709-711.

M. Rotter et al., "Single Chip Fused Hybrids for Acousto-Electric and Acousto-Optic Applications," *1997 Applied Physics Letters*, vol. 70(16), Apr. 21, 1997, pp. 2097-2099.

A. Mansingh et al., "Surface Acoustic Wave Propagation in PZT/YBCO/$SrTiO_3$ and $PbTiO_3$/YBCO/$SrTiO_3$ Epitaxial Heterostructures," *Ferroelectric*, vol. 224, pp. 275-282, 1999.

S. Mathews et al., "Ferroelectric Field Effect Transistor Based on Epitaxial Perovskite Heterostructures", *Science*, vol. 276, Apr. 11, 1997, pp. 238-240.

R. Houdre et al., "Properties of GaAs on Si Grown by Molecular Beam Epitaxy." *Solid State and Materials Sciences*, vol. 16, Issue 2, 1990, pp. 91-114.

S. F. Fang et al., "Gallium Arsenide and Other Compound Semiconductors on Silicon," *J. Appl. Phys.*, 68(7), Oct. 1, 1990, pp. R31-R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884-1886.

Ringel et al., "Epitaxial Integration of III-V Materials and Devices with Si Using Graded GeSi Buffers," 27th International Symposium on Compound Semiconductors, Oct. 2000.

Zogg et al., "Progress in Compound-Semiconductor-on-Silicon-Heteroepitaxy with Fluoride Buffer Layers," *J. Electrochem Soc.*, vol. 136, No. 3, Mar. 1998, pp. 775-779.

Xiong et al., "Oxide Defined GaAs Vertical-Cavity Surface-Emitting Lasers on Si Substrates," *IEEE Photonics Technology Letters*, vol. 12, No. 2, Feb. 2000, pp. 110-112.

Clem et al., "Investigation of PZT/LSCO//Pt//Aerogel Thin Film Composites for Uncooled Pyroelectric IR Detectors," *Mat. Res. Soc. Symp. Proc.*, vol. 541, pp. 661-666, 1999.

Gunapala et al., "Bound-To-Quasi-Bound Quantum-Well Infrared Photodetectors," NASA Tech Brief, vol. 22, No. 9, Sep. 1998.

Abhay M. Joshi et al., "Monolithic InGaAs-on-silicon Wave Infrared Detector Arrays," *Intn. Society for Optical Engineering*, vol. 2999, pp. 211-224.

Bruley et al., "Nanostructure and Chemistry of a (100)MgO/(100) GaAs Interface," *Appl. Phys Lett*, 65(5), Aug. 1994, pp. 564-566.

Fork et al., "Epitaxial MgO On Si(001) for Y-Ba-Cu-O Thin Film Growth by Pulsed Laser Deposition," *Appl. Phys Lett.*, 58(20), May 20, 1991, pp. 2294-2296.

Himpsel et al., "Dialectrics on Semiconductors," *Materials Science and Engineering*, B1(1988), pp. 9-13.

Li et al., "Epitaxial La$_{0.07}$Sr$_{0.33}$MnO$_3$ Magnetic Tunnel Junctions, " *J. Appl. Phys.* 81(B), Apr. 15, 1997, pp. 5509-5511.

O'Donnell et al., "Colossal Magnetoresistance Magnetic Tunnel Junctions Grown by Molecular-Beam Epitaxy," *Appl. Physics Letters*, vol. 76, No. 14, Apr. 3, 2000, pp. 1914-1996.

Mikami et al., "Formation of Si Epi/MgO-Al$_2$O$_3$Epl./SiO$_3$/Si and Its Epitaxial Film Quality," Fundamental Research Laboratories and Microelectronics Laboratories, pp. 31-34, 1983.

T. Asano et al., "An Epitaxial Si/Insulator/Si Structure Prepared by Vacuum Deposition of CaF$_2$ and Silicon," *Thin. Solid Films*, vol. 93 (1982), pp. 143-150.

T. Chikyow et al., "Reaction and Regrowth Control of CeO$_2$ on Si(111) Surface for the Silicon-On-Insulator Structure," *Appl. Phys. Lett.*, vol. 65, No. 8, Aug. 22, 1994, pp. 1030-1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225-227, 1998.

R.A. Morgan et al., "Vertical-Cavity Surface-Emitting Lasers Come of Age," *SPIE*, vol. 2683, pp. 18-29.

"Technical Analysis of Qualcomm QCP-800 Portable Cellular Phone (Transmitter Circuitry)," Taius Corporation, Qualcomm QCP-800 Technical Analysis Report, Dec. 10, 1996, pp. 5-8.

Jo-Ey Wong, et al.; "An Electrostatically-Actuated MEMS Switch for Power Applications"; IEEE, 2000; pp. 633-638.

T. Mizuno, et al.; "Electron and Hole Mobility Enhancement in Strained-Si MOSFET's on SiGe-on-Insulator Substrates Fabricated by SIMOX Technology"; IEEE Electron Device Letters, vol. 21. No. 5, May 2000; pp. 230-232.

F.M. Buffer, et al.; "Strian-dependence of electron transport in bulk Si and deep-submicron MOSFET's" Computatural Electronics, 2000, Book of Abstracts, IWCE Glasgow 2000, 7th Int'l Workshop on, 2000; pp. 64-65.

S.S. Lu, et al.; "Piezoelectric field effect transistor (PEFET) using In$_{0.2}$Ga$_{0.8}$As/Al$_{9.35}$Ga$_{0.65}$As/In$_{9.2}$Ga$_{0.6}$As/GaAs Strained layer structure on (111)B GaAs substrate"; Electronics Letters, 12th Ma 1994, vol. 30, No. 10; pp. 823-825.

Kihong Kim, et al."On-Chip Wireless Interconnection with Integrated Antennas"; 2000 IEEE; pp. 20.2.1-20.3.4.

G. Passiopoulos, et al.; "V-Band Single Chip, Direct Carrier BPSK Modulaton Transmitter with Integrated Patch Antenna"; 1998 IEEE MTT-S Digest; pp. 305-308.

Mau-Chung Frank Chang, et al.; "RF/Wireless Interconnect for Inter- and Intra-Chip Communications"; Proceedings of the IEEE, vol. 89, No. 4, Apr. 2001; pp. 456-466.

The Electronics Industry Report; Prismark; 2001; pp. 111-120.

J.K. Abrokwah, et al.; "A Manufacturable Complementary GaAs Process"; GaAs IC Symposium, IEEE, 1993; pp. 127-130.

H. Nagata, "A Preliminary Consideration of the Growth Behaviour of CeO$_2$, SrTiO$_3$ and SrVO$_3$ Films on Si Substrate," *Thin Solid Films*, 224, 1993, pp. 1-3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.*, vol. 30, No. 68, Jun. 1991, pp. L1136-L1138.

Kado et al., "Heteroepitaxial Growth of SrO Films on Si Substrates," *J. Appl. Phys.*, 61(6), Mar. 15, 1987, pp. 2398-2400.

H. Ishiwara et al., "Epitaxial Growth of Perovskite Type Oxide Films on Substrates"; *Materials Research Symposium Proceedings*, vol. 220, pp. 595-600, Apr. 29-May 3, 1991.

J.K. Abrokwah, et al.; "A Manufacturable High-Speed Low-Power Complementary GaAs Process"; Extended Abstracts of the 1994 International Conference on Solid State Devices and Materials, Yokohama,. 1994, pp. 592-594.

C.J. Palmstrom et al.; "Stable and Epitaxial Contacts to III-V Compound Semiconductors"; Contacts to Semiconductors Fundamentals and Technology; Noyles Publications, 1993; pp. 67-150.

Jayshri Sabarinathat, et al.; "Submicron three-dimensional infrared GaAs/$Al_xO_y$-based photonic crystal using single-step epitaxial growth"; Applied Physics Letters, vol. 78, No. 20, May 14, 2001; pp. 3024-3026.

Philip Ball; "The Next Generation of Optical Fibers"; Technology Review, May 2001; pp. 55-61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51-96.

G. H. Jin, et al.; "PLZT Film Waveguide Mach-Zehnder Electrooptic Modulator"; Journal of Lightwave Technology, vol. 18, No. 6, Jun. 2000; pp. 807-812.

D.E. Aspnes, et al.; "Steps on (001) silicon surfaces"; J. Vac. Sci. Technol. B, vol. 5, No. 4, Jul./Aug. 1987; pp. 939-944.

D.M. Newns, et al.; "Mott transition field effect transistor"; Applied Physics Letters, vol. 73, No. 6, Aug. 10, 1998; pp. 780-782.

Lucent Technologies, Inc. "Arrayed Waveguide Grating Multiplexer/Demultiplexer"; Jan. 2000; 4 pages.

Hisashi Shichijo, et al.; "Co-Integration of GaAs MESFET and Si CMOS Circuits"; IEEE Electron Device Letters, vol. 9, No. 9, Sep. 1988; pp. 444-446.

H. Shichijo, et al.; "GaAs MESFET and Si CMOS Cointegration and Circuit Techniques"; 1988 IEEE; GaAs IC Symposium 239-242.

H. Shichijo, et al.; "Monolithic Process for Co-Integration of GaAs and Silicon Circuits"; 1988 IEEE; pp. 778-781.

Z.H. Zhu, et al. "Growth of InGaAs multi-quantum wells at 1.3 m wavelength on GaAs compliant substrates"; Applied Physics Letters, vol. 72, No. 20, May 18, 1998; pp. 2598-2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507-509.

Tomonori Nagashima, et al.; "Three-Terminal Tandem Solar Cells With a Back-Contact Type Bottom Cell" Higashifuji Technical Center, Toyota Motor Corporation; 4 pages.

James Schellenberg, et al.; "Low-Loss, Planar Monolithic Baluns for K/Ka-Band Applications"; 1999 IEEE MTT-S Digest; pp. 1733-1736.

Arnold Leitner et al; "Pulsed Laser Deposition of Superconducting Strontium Titanate Thin-Films"; ; Session K11-Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on -$Al_2O_3$, Si and 6H-SiC by pulsed laser deposition"; Thin Solid Films 299 (1997), pp. 94-103.

T. Warren Weeks, et al.; "GaN thin films deposited via organometallic vapor phase epitaxy on (6H)-SiC(0001) using high-temperature monocrystalline AlN buffer layers" 320 Applied Physics Letters, vol. 67, No. 3, Jul. 17, 1995, pp. I401-403.

Z. Yu, et al.; "Epitaxial oxide thin films on Si(001)"; J. Vac. Sci. Technol. B. vol. 18, No. 4, Jul./Aug. 2000: pp. 2139-2145.

Gentex Corporate Website; Photoelectric Smoke Detectors—How They Work; 2001.

Jeffrey B. Casady, et al.; "A Hybrid 6H-SiC Temperature Sensor Operational from 25 C to 500 C"; IEEE Transactions on Components, Packaging, and Manufacturing Technology—Part A, vol. 19, No. 3, Sep. 1996; pp. 416-422.

Ronald W. Waynant, et al.; "Optoelectronic Integrated Circuits"; Electro-Optics Handbook, McGraw-Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37-42.

D.A. Francis, et al.; "A single-chip linear optical amplifier"; OFC, 2001; Mar. 17-22, 2001.

G. Vogg et al.; "Epitaxial alloy films of zinti-phase Ca(Si1-xGex)2"; Journal of Crystal Growth 223 (2001); pp. 573-576.

Peter S. Guilfoyle, et al.; "Optoelectronic Architecture for High-Speed Switching and Processing Applications"; 1998 The Photonics Design and Applications Handbook; pp. H-399-H-406.

Gerald B. Stringfellow; "Organometallic Vapor-Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer-Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GainAs Supercoducting FET," IBM Technical Bulletin, vol. 36, No. 8, Aug. 1993, p. 655-656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472-1477.

Yodo et al., GaAs Heteroepitaxial Growth on Si Substrates with Thin Si Interlayers *in situ* Annealed at High Temperatures, *8257b Journal of Vacuum Science & Technology*, 1995 May/Jun., vol. 13, No. 3, pp. 1000-1005.

Cuomo et al., "Substrate Effect on the Superconductivity of $YBa_2Cu_3(O_7$ Thin Films," AIP Conference 1988, pp. 141-148.

McKee et al., "Crystalline Oxides on Silicon: The First Five Monolayers," *Physical Review Letters*, vol. 81, No. 14, Oct. 1998, pp. 3014-3017.

McKee et al., "Molecular Beam Epitaxy Growth of Epitaxial Barium Silicide, Barium Oxide, and Barium Titanate on Silicon," *1991 American Institute of Physics*, pp. 782-784, Aug. 13, 1991.

Tambo et al., Molecular Beam Epitaxy Growth of $SrTiO_3$ Films on Si(100)-2x1 with SrO Buffer Layer, *Jpn. J. Appl. Phys.*, vol. 37, 1998, pp. 4454-4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309-314.

McKee et al., "$BaSi_2$ and Thin Film Alkaline Earth Silicides on Silicon," *Appl. Phys. Lett.*, 63 (20), Nov. 1993, pp. 2818-2820.

McKee et al., "Surface Structures and the Orthorhombic Transformation of Thin Film $BaSi_2$ on Silicon," *Mat. Res. Soc. Symp. Proc.*, vol. 221, pp. 131-136.

Brian A. Floyd, et al.; "The projected Power Consumption of a Wireless Clock Distribution System and Comparison to Conventional Distribution Systems"; IEEE, 1999; pp. IITC99-249-IITC99-250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415-L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911-5916.

Farrow et al., "Heteroepitaxy of Dissimilar Materials," *Mat. Res. Soc. Symposium Proceedings*, vol. 221, pp. 29-34, Apr. 29-May 2, 1991.

Ishiwara et al., "Heteroepitaxy on Silicon: Fundamentals, Structure, and Devices," *Mat. Res. Soc.*, Symposium Proceedings, vol. 116, pp. 369-374, Apr. 5-8, 1988.

Douglas B. Chrisey, et al; Pulsed Laser Deposition of Thin Films; pp. 273-285.

B.A. Block, et al; "Photoluminescence properties of $Er^3$-doped $BaTiO_3$ thin films"; Appl. Phys. Lett. 65 (1), Jul. 4, 1994, pp. 25-27.

Kevin J. Chen et al; "A Novel Ultrafast Functional Device: Resonant Tunnelling High Electron Mobility Transistor"; Electron Devices Meetingk 1996; IEEE Hong Kong; Jun. 29, 1996; pp. 60-63, XP010210167.

Wenhua Zhu et al.; "Molecular Beam Epitaxy of GaAs on Si-on-Insulator"; 320 Applied Physics Letters 59(1991) Jul. 8, No. 2; pp. 210-212.

Umesh K. Mishra et al; "Oxide Based Compound Semiconductor Electronics"; Electron Devices Meeting; 1997; Technical Digest, International; Washington, D.C.; Dec. 7-10 1997, pp. 545-548.

J.M. Daughton et al.; "Applications of Spin Dependent Transport Materials"; J. Phys. D. Appl. Phys. 32(1999) R169-R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143-14146.

Q.-Y. Tong et al.; "IOS-a new type of materials combination for system-on-a chip preparation"; 1999 IEEE International SOI Conference, Oct. 1999; pp. 104-105.

T. Kanniainen et al.; "Growth of Dielectric 1hfo2/Ta2O5 Thin Film Nanolaminate Capacitors By Atomic Layer Epitaxy"; Electrochemical Society Proceedings, U.S. Electrochemical Society; Pennington, N.J.; Aug. 31, 1997; pp. 36-46.

Myung Bok Lee; "Heteroepitaxial Growth of $BaTio_3$ Films on Si by Pulsed Laser Deposition"; Applied Physics Letters; Mar. 13, 1995; pp. 1331-1333.

Myung Bok Lee; "Formation and Characterization of Eptiaxial $TiO_2$ and $BaTiO_3/TiO_2$ Films on Si Substrate"; Japan Journal Applied Physics Letters; vol. 34; 1995; pp. 808-811.

Gilbert Lecarpentier et al.; "High Accuracy Machine Automated Assembly for Opto Electronics"; 2000 Electronic Components and Technology Conference; pp. 1-4.

R. Ramesh; "Ferroelectric La-Sr-Co-O/Pb-Zr-Ti-O/La-Sr-Co-O Heterostructures on Silicon via Template Growth"; 320 Applied Physics Letters; 63(1993); Dec. 27; No. 26; pp. 3592-3594.

K. Elsenbeiser; "Field Effect Transistors with $SrTiO_3$ Gate Dielectric on Si"; Applied Physics Letters; vol. 76, No. 10; Mar. 6, 2000; pp. 1324-1326.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in $La_{0.6}Sr_{0.2}MnO_3/SrTiO_3/La_{0.6}Sr_{0.2}MnO_3$ Junctions with 1.6-nm-Thick Barriers"; Applied Physics Letters; vol. 74, No. 2; Jan. 11, 1999; pp. 290-292.

Wei Zhang et al.; "Enhanced Magnetoresistance in La-Ca-Mn-O Films on Si Substrates Using $YbaCuO/CeO_2$ Heterostructures"; Physica C; Vol. 282-287, No. 2003; Aug. 1, 1997; pp. 1231-1232.

Shogo Imada et al; Epitaxial Growth of Ferroelectric $YmnO_3$ Thin Films on Si (111) Substrates by Molecular Beam Epitaxy; Jpn. J. Appl. Phys. vol. 37 (1998): pp. 6497-6501; Part 1, No. 12A, Dec. 1998.

Ladislay Pust et al.; "Temperature Dependence of the Magnetization Reversal in Co(fcc)-BN-Co-(poly hcp) Structures"; Journal of Applied Physics; vol. 85, No. 8; Apr. 15, 1999; pp. 5765-5767.

C. Martinez; "Epitaxial Metallic Nanostructures on GaAs"; Surface Science; vol. 482-485; pp. 910-915; 2001.

Wen-Ching Shih et al.; "Theoretical investigation of the SAW Properties of Ferroelectric Film Composite Structures"; IEEE Transactions of Ultrasonics, Ferroelectrics, and Frequency Control; vol. 45, No. 2; Mar. 1998; pp. 305-316.

Zhu Dazhong et al.; "Design of $ZnO/SiO_2/Si$ Monolithic Integrated Programmable SAW Filter"; Proceedings of Fifth International Conference on Solid-State and Integrated Circuit Technology; 21-23; Oct. 1998: pp. 826-829.

Kirk-Othmer Encyclopedia of Chemical Technology; Fourth Edition, vol. 12; Fuel Resources to Heat Stabilizers; A Wiley-Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAIAs MODFETs and RTDs an InP-bonded-to Si Substrate"; Fourth International Conference on Indium Phosphide and Related Materials,, Newport, RI, USA; Apr. 21-24, 1992 ; pp. 167-170; XP000341253; IEEE, New York, NY, USA; ISBN: 0-7803-0522-1.

H. Takahashi et al.; "Arrayed-Waveguide Grating For Wavelength Division Multi/Demultiplexer With Nanometre REsolution"; Electronics Letters; vol. 26., No. 2, Jan. 18, 1990.

Pierrel, R.F.; "1/J-FET and MESFET"; Field Effect Devices; MA, Addison-Wesley; 1990; pp. 9-22.

M. Schreiter, et al.; "Sputtering of Self-Polarized PZT Films for IR-Detector Arrays"; 1998 IEEE; pp. 181-185.

Hideaki Adachi et al.; "Sputtering Preparation of Ferroelectric PLZT Thin Films and Their Optical Applications"; IEEE Transactions of Ultrasonics, Ferrolectrics and Frequency Control, vol. 38, No. 6, Nov. 1991.

A.J. Moulson et al.; "Electroceramics Materials Properties Applications"; Chapman & Hall; pp. 366-369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109-114.

Wang et al.; "Depletion-Mode GaAs MOSFETs with Negligible Drain Current Drift and Hysteresis"; Electron Devices Meeting, 1998, IEDM '98 Technical Digest; pp. 67-70.

Ben G. Streetman; "Solid State Electronic Devices"; 1990, Prentice Hall; Third Edition; pp. 320-322.

A. Y Wu et al.; "Highly Oriented $(Pb,La)(Zr,Ti)O_3$ Thin Films on Amorphous Substrates"; IEEE, 1992; pp. 301-304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321-326.

S.N. Subbarao et al.; "Monolithic PIN Photodetector and FET Amplifier on GaAs-os-Si"; IEEE; GaAs IC Symposium-163-166; 1989.

T.A. Langdo et al.; "High Quality Ge on Si by Epitaxial Necking"; Applied Physics Letters; vol. 76, No. 25; pp. 3700-3702; Jun. 19, 2000.

Chenning Hu et al.; Solar Cells From Basics to Advanced Systems; McGraw-Hill Book Company; 1983.

O.J. Painter et al; "Room Temperature Photonic Crystal Defect Lasers at Near-Infrared Wavelengths in InGaAsp"; Journal of Lightwave Technology, vol. 17, No. 11; Nov. 1999.

C. Donn et al.; "A 16-Element, K-Band Monolithic Active Receive Phased Array Antenna"; Antennas and Propagation Society International Symposium, 1988; pp. 188-191, vol. 1; Jun. 6-10, 1988.

Don W. Shaw; "Epitaxial GaAs on Si: Progress and Potential Applications"; Mat. Res. Soc. Symp. Proc.; pp. 15-30; 1987.

G.J.M. Dormans, et al; "$PbTiO_3$/Thin Films Grown by Organometallic Chemical Vapour Deposition"; Third International Symposium on Integrated Ferroelectrics; Apr. 3-5, 1991 (Abstract).

P.J. Borrelli et al.; "Compositional and Structural Pproperties of Sputtered PLZT Thin Films"; Ferroelectric Thin Films II Symposium; Dec. 2-4, 1991 (Abstract).

Ranu Nayak et al; "Enhanced acousto-optic diffraction efficiency in a symmetric SrRiO3/BaTiO3/SrTiO3 thin-film heterostructure"; Nov. 1, 2000; vol. 39, No. 31; Applied Optics; pp. 5847-5853.

Ranu Nayak et al; "Studies on acousto-optical interaction in SrTiO3/BaTiO3/SrTiO3 epitaxial thin film heterostructures"; J. Phys. D: Appl. Phys. 32 (1999) 380-387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358-367.

V. Kaushik et al.; "Device Characteristics of Crystalline Epitaxial Oxides on Silicon";Device Research Conference, 2000; Conference Digest 58th DRC; pp. 17-20; Jun. 19-21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TICS 4, Prof. Sands. MSE 225, Apr. 12, 2002; pp. 1-5.

S.A. Chambers et al; "Band Discontinuities at Epitaxial SrTiO3/Si(001) Heterojunctions"; Applied Physics Letters; vol. 77, No. 11; Sep. 11, 2000; pp. 1662-1664.

H. Wang et al.; "GaAs/GaAlAs Power HBTs for Mobile Communications"; Microwave Symposium Digest; 1993 IEEE; vol. 2.; pp. 549-552.

Y. Ota et al.; "Application of Heterojunction FET to Power Amplifier for Cellular Telephone"; Electronics Letters; May 26, 1994; vol. 30, No. 11; pp. 906-907.

Keiichi Sakuno et al; "A 3.5W HBT MMIC Power Amplifier Module for Mobile Communications"; IEEE 1994; Microwave and Millimeter-Wave Monolithic Circuits Symposium; pp. 63-66.

Mitsubishi Semiconductors Press Release (GaAs FET's) Nov. 8, 1999 pp. 1-2.

R.J. Matyi et al; "Selected Area Heteroepitaxial Growth of GaAs on Silicon for Advanced Device Structures"; 2194 Thin Solid Films; 181 Dec. 10, 1989; No. 1; pp. 213-225.

K. Nashimoto et al; "Patterning of Nb, LaOnZr, TiO3 Waveguides for Fabricationg Micro-Optics Using Wet Etching and Solid-Phase Epitaxy"; Applied Physics Letters; vol. 75, No. 8; Aug. 23, 1999; pp. 1054-1056.

Bang-Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837-840.

Man Fai Ng et al; "Heteroepitaxial growth of lanthanum aluminate films derived from mixed metal nitrates"; Journal of Materials Research; vol. 12, No. 5, pp. 1306.

Yuji Matsumoto et al.; "Room-Temperature Ferromagnetism in Transparent Transition Metal-Doped Titanium Dioxide"; Science; Feb. 2, 2001; vol. 291; pp. 854-856.

S.A. Chambers et al.; "Epitaxial Growth and Properties of Ferromagnetic Co-Doped TiO2 Anatase"; Applied Physics Letters; vol. 79, No. 21; Nov. 19, 2001; pp. 3467-3469.

Peter Weiss; "Speed demon gets hooked on silicon"; Science News Online; Sep. 15, 2001; pp. 1-3.

"Motorola Develops New Super-Fast Chip"; USA Today; Sep. 4, 2001.

Lori Valigra; "Motorola Lays GaAs on Si Wafer"; AsiaBizTech; Nov. 2001pp. 1-3.

"Holy Graill Motorola Claims High-Yield GaAs Breakthrough"; Micromagazine.com, no date available; pp. 1-3.

Jong-Gul Yoon; "Growth of Ferroelectric LiNbO3 Thin Film on MgO-Buffered Si by the Sol-Gel Method"; Journal of the Korean Physical Society (Proc. Suppl.); vol. 29, Nov. 1996; pp. S648-S651.

V. Bornand et al.; "Deposition of LiTaO3 thin films by pyrosol process"; Thin Solid Films 304 (1997); pp. 239-244.

R. Droopad et al.; "Development of high dielectric constant epitaxial oxides on silicon by molecular beam epitaxy"; Materials Science and Engineering B87 (2001); pp. 292-296.

A.K. Sharma et al.; "Integration of Pb(Zr0.52Ti0.48)O3 epilayers with Si by domain epitaxy"; Applied Physics Letters, vol. 76, No. 11; Mar. 13, 2000; pp. 1458-1460.

Dwight C. Streit et al; "High-Reliability GaAs-AlGaAs HBT's by MBE with Be Base Doping and InGaAs Emitter Contacts"; 8179 Ieee Electron Device Letters; Sep. 12, 1991, No. 9, New York, US.

C. Y. Hung et al; "Piezoelectrically induced stress tuning of electro-optic devices"; 320 Applied Physics Letters; 59 Dec. 30, 1991, No. 27, New York, US.

J. Piprek; "Heat Flow Analysis of Long-Wvelength VCSELs with Various DBR Materials"; University of Delaware, Materials Science, Newark, DE, 19716-3106; Oct. 31, 1994; pp. 286-287.

P. Mackowiak et al.; "Some aspects of designing an efficient nitride VCSEL resonator"; J. Phys. D: Appl. Phys. 34(2001); pp. 954-958.

M.R. Wilson et al.; GaAs-On-Si: A GaAs IC Manufacturer's Perspective; GaAs IC Symposium, IEEE, 1988; pp. 243-246.

Y. Kitano et al.; "Thin film crystal growth of BaZrO3 at low oxygen partial pressure"; Journal of Crystal Growth 243 (2002); pp. 164-169.

M.E. Hawley; et al; "Microstructural Study of Colossal Magneto-Resistive Films As a Function of Growth Temperature, As Deposited and Annealed"; 401, 1996; pp. 531-536.

Charles Kittel: "Introduction to Solid State Physics"; John Wiley & Sons, Inc. Fifth Edition; pp. 415.

Chyuan-Wei Chen et al; "Liquid-phase epitaxial growth and characterization of InGaAsP layers grown on GaAsP substrates for application to orange light-emitting diodes"; 931 Journal of Applied Physics; 77 Jan. 15, 1995, No. 2; Woodbury, NY, US; pp. 905-909.

W. Zhu et al. ; "Oriented diamond films grown on nickel substrates"; 320 Applied Physics Lettters; 63 Sep. 1993, No. 12, Woodbury, NY, US: pp. 1640-1642.

M. Schreck et al. ; "Diamond/Ir/SrTiO3: A material combination for improved heteroepitaxial diamond films"; Applied Physics Letters; vol. 74, No. 5; Feb. 1, 1999; pp. 650-652.

Yoshihiro Yokota et al. ; "Cathodoluminescence of boron-doped heteroepitaxial diamond films on platinum"; Diamond and Related Materials 8 (1999) ; pp. 1587-1591.

J. R. Busch et al. ; "Linear Electro-Optic Response in Sol-Gel PZT Planar Waveguide"; Electronics Letters; Aug. 13, 1992; vol. 28, No. 17; pp. 1591-1592.

R. Droopad et al ; "Epitaxial Oxide Films on Silicon: Growth, Modeling and Device Properties" ; Mat. Res. Soc. Symp. Proc. vol. 619; 2000 Materials Research Society; pp. 155-165.

H. Ohkubo et al. ; "Fabrication of High Quality Perovskite Oxide Films by Lateral Epitaxy Verified with RHEED Oscillation" ; 2419A Int. Conf. on Solid State Devices & Materials, Tsukuba, Aug. 26-28, 1992; pp. 457-459.

Lin Li; "Ferroelectric/Superconductor Heterostructures" ; Materials Science and Engineering; 29 (2000) pp. 153-181.

L. Fan et al. ; "Dynaamic Beam Switching of Vertical-Cavity Surface-Emitting Lasers with Integrated Optical Beam Routers" ; IEEE Photonics Technology Letters; vol. 9, No. 4; Apr. 4, 1997; pp. 505-507.

Y. Q. Xu. et al. ; "(Mn, Sb) dropped-Pd (Zr, Ti)03 infrared detector arrays" ; Journal of Applied Physics; vol. 88, No. 2; Jul. 15, 2000; pp. 1004-1007.

Kiyoko Kato et al. ; "Reduction of disclocations in InGaAs layer on GaAs using epitaxial lateral overgrowth" ; 2300 Journal of Crystal Growth 115 (1991) pp. 174-179; Dec. 1991.

* cited by examiner

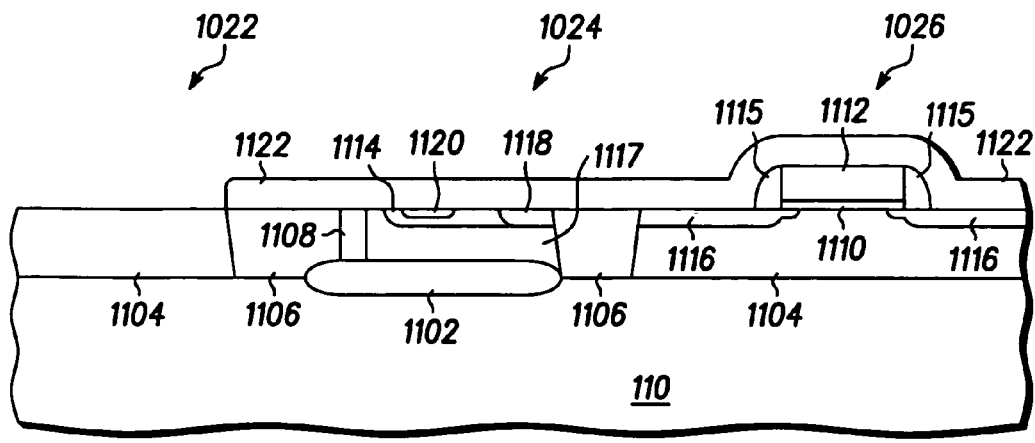
103  *FIG. 26*
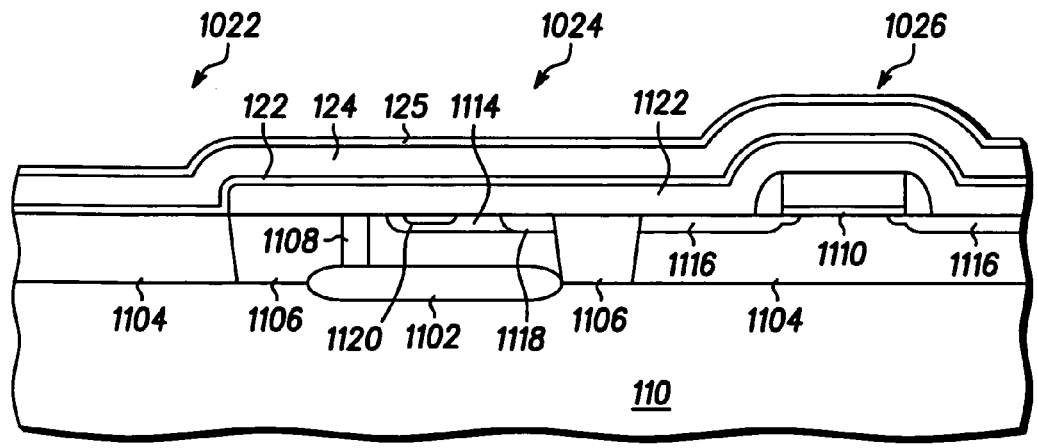
103  *FIG. 27*
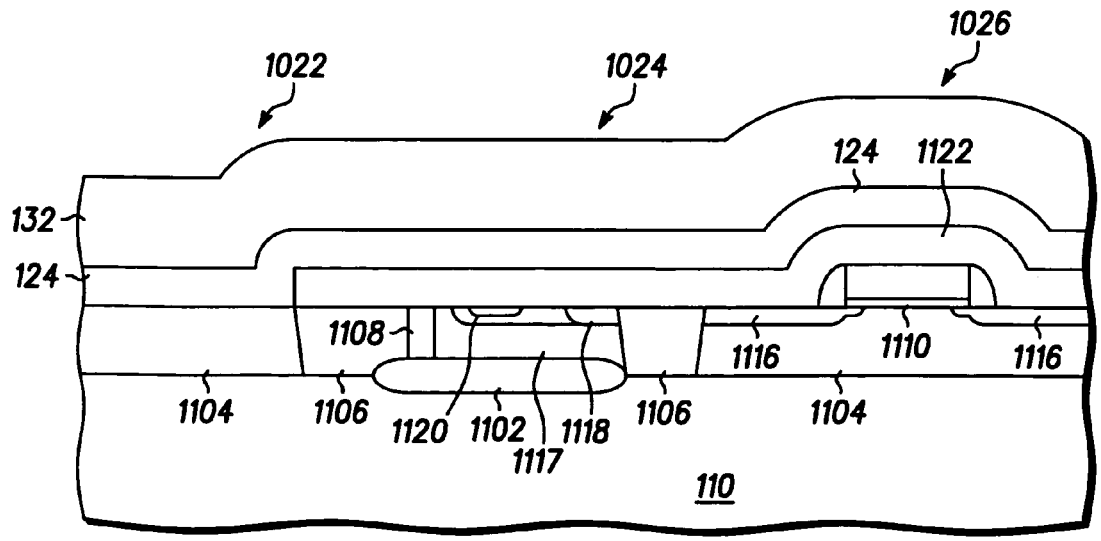
103  *FIG. 28*

STRUCTURE AND METHOD FOR FABRICATING SEMICONDUCTOR STRUCTURES AND DEVICES FOR DETECTING AN OBJECT

This application is a continuation of application Ser. No. 09/928,356, filed Aug. 14, 2001 now abandoned.

FIELD OF THE INVENTION

This invention relates generally to semiconductor structures and devices and to a method for their fabrication, and more specifically to semiconductor structures and devices and to the fabrication and use of semiconductor structures, devices, and integrated circuits that include a monocrystalline material layer comprised of semiconductor material, compound semiconductor material, and/or other types of material such as metals and non-metals for detecting an object.

BACKGROUND OF THE INVENTION

Semiconductor devices often include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material was available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Accordingly, a need exists for a semiconductor structure that provides a high quality monocrystalline film or layer over another monocrystalline material and for a process for making such a structure. In other words, there is a need for providing the formation of a monocrystalline substrate that is compliant with a high quality monocrystalline material layer so that true two-dimensional growth can be achieved for the formation of quality semiconductor structures, devices and integrated circuits having grown monocrystalline film having the same crystal orientation as an underlying substrate. This monocrystalline material layer may be comprised of a semiconductor material, a compound semiconductor material, and other types of material such as metals and non-metals.

Furthermore, a need exists for a semiconductor structure that provides a high quality monocrystalline film or layer over another monocrystalline material and a process for making such a structure to detect an object. A detection device such as a radar or a lidar may use transmitted and reflected radio waves or laser light for detecting an object. The detection device may further determine the range (i.e., distance or height) between the device itself and the object, and also the speed of the object as it either approaches or moves away from the device. Typically, detection devices require multiple components to detect an object. In particular, a detection device requires a source component and a receiver component. To reduce size, cost, and power consumption, it is desirable to integrate all components on a single semiconductor structure. However, semiconductor structures have not been available to do so.

BRIEF DESCRIPTION OF THE DRAWINGS

The present invention is illustrated by way of example and not limitation in the accompanying figures, in which like references indicate similar elements, and in which:

FIGS. 26–30 include illustrations of cross-sectional views of a portion of an integrated circuit that includes a compound semiconductor portion, a bipolar portion, and an MOS portion in accordance with what is shown herein;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
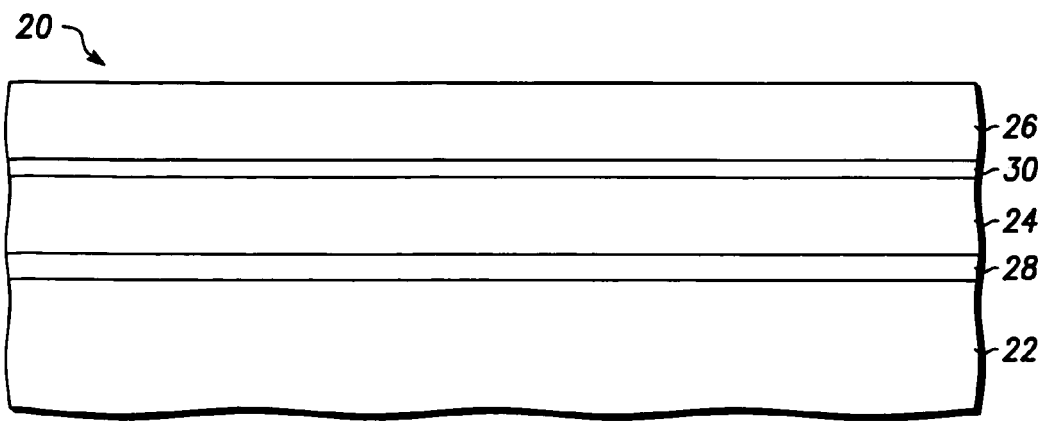
FIGS. 1, 2, and 3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table, e.g., carbon, silicon, etc. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, a compound semiconductor material, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The material for monocrystalline material layer 26 can be selected, as desired, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. However, monocrystalline material layer 26 may also comprise other semiconductor materials, metals, or non-metal materials which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

Figure 2:
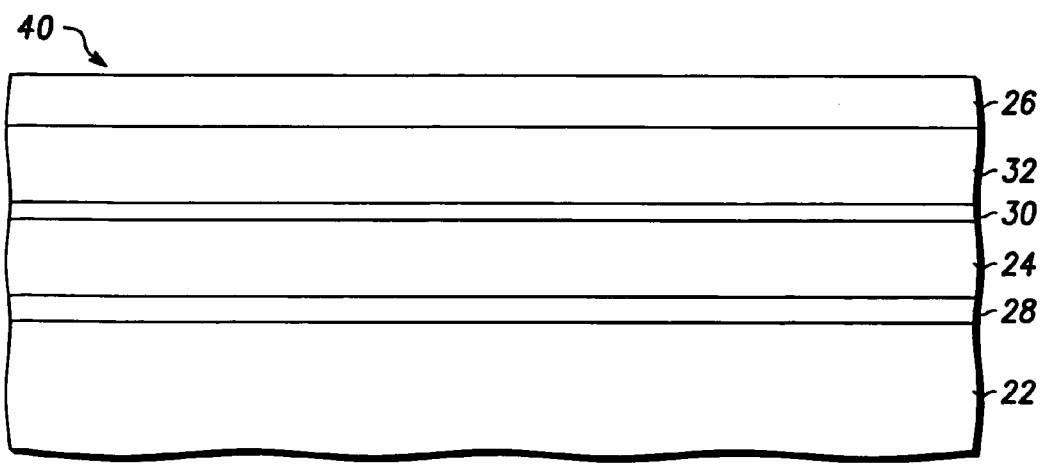

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26. Specifically, the additional buffer layer is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
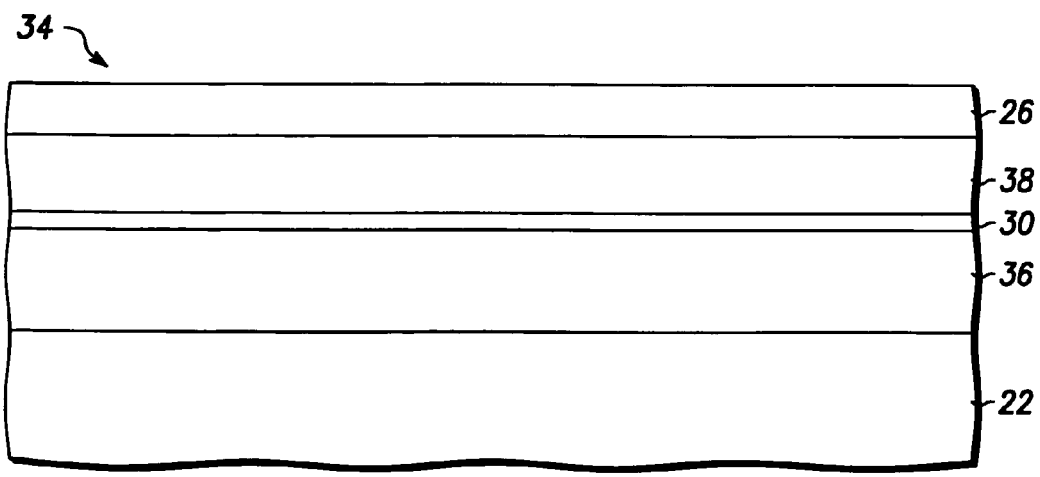

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides a true compliant substrate for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV or monocrystalline compound semiconductor materials.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) that is thick enough to form devices within layer 38. In this case, a semiconductor structure in accordance with the present invention does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 5 nm. In general, it is desired to have an accommodating buffer layer thick enough to isolate the monocrystalline material layer 26 from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this embodiment of the invention, monocrystalline material layer 26 is a compound semiconductor layer of gallium arsenide (GaAs) or aluminum gallium arsenide (AlGaAs) having a thickness of about 1 nm to about 100 micrometers (μm) and preferably a thickness of about 0.5 μm to 10 μm. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been illustrated to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of a monocrystalline material layer which comprises compound semiconductor materials in the indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 µm. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. Where the monocrystalline layer comprises a compound semiconductor material, the II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, accommodating buffer layer 24, and monocrystalline material layer 26 can be similar to those described in example 1. In addition, an additional buffer layer 32 serves to alleviate any strains that might result from a mismatch of the crystal lattice of the accommodating buffer layer and the lattice of the monocrystalline material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying monocrystalline material which in this example is a compound semiconductor material. The compositions of other compound semiconductor materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline material layer which in this example is a compound semiconductor material. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline material layer 26 and template layer 30 can be the same as those described above in example 2. In addition, additional buffer layer 32 is inserted between the accommodating buffer layer and the overlying monocrystalline material layer. The additional buffer layer 32, a further monocrystalline material which in this instance comprises a semiconductor material, can be, for example, a graded layer of indium gallium arsenide (InGaAs) or indium aluminum arsenide (InAlAs). In accordance with one aspect of this embodiment, additional buffer layer 32 includes InGaAs, in which the indium composition varies from 0 to about 50%. The additional buffer layer 32 preferably has a thickness of about 10–30 nm. Varying the composition of the buffer layer from GaAs to InGaAs serves to provide a lattice match between the underlying monocrystalline oxide material and the overlying layer of monocrystalline material which in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and Sr$_z$Ba$_{1-z}$TiO$_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
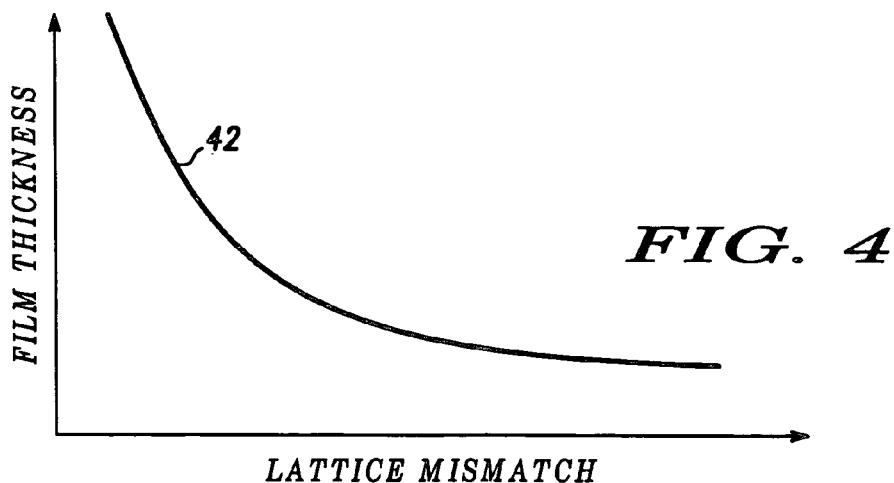
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, aluminum gallium arsenide, zinc selenide, or zinc sulfur selenide and the accommodating buffer layer is monocrystalline Sr$_x$Ba$_{1-x}$TiO$_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown monocrystalline material layer can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 4° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
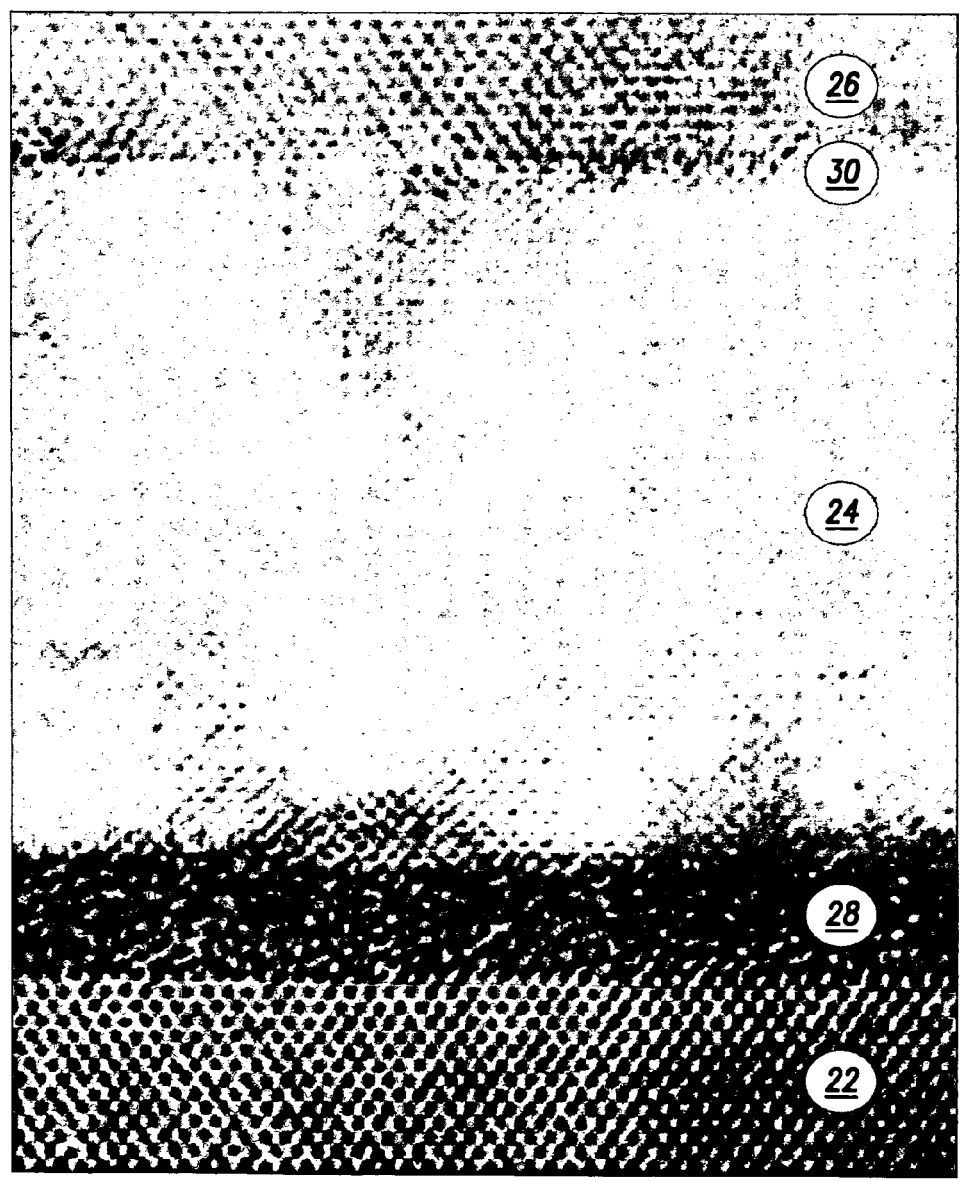
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with one embodiment of the present invention. Single crystal $SrTiO_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
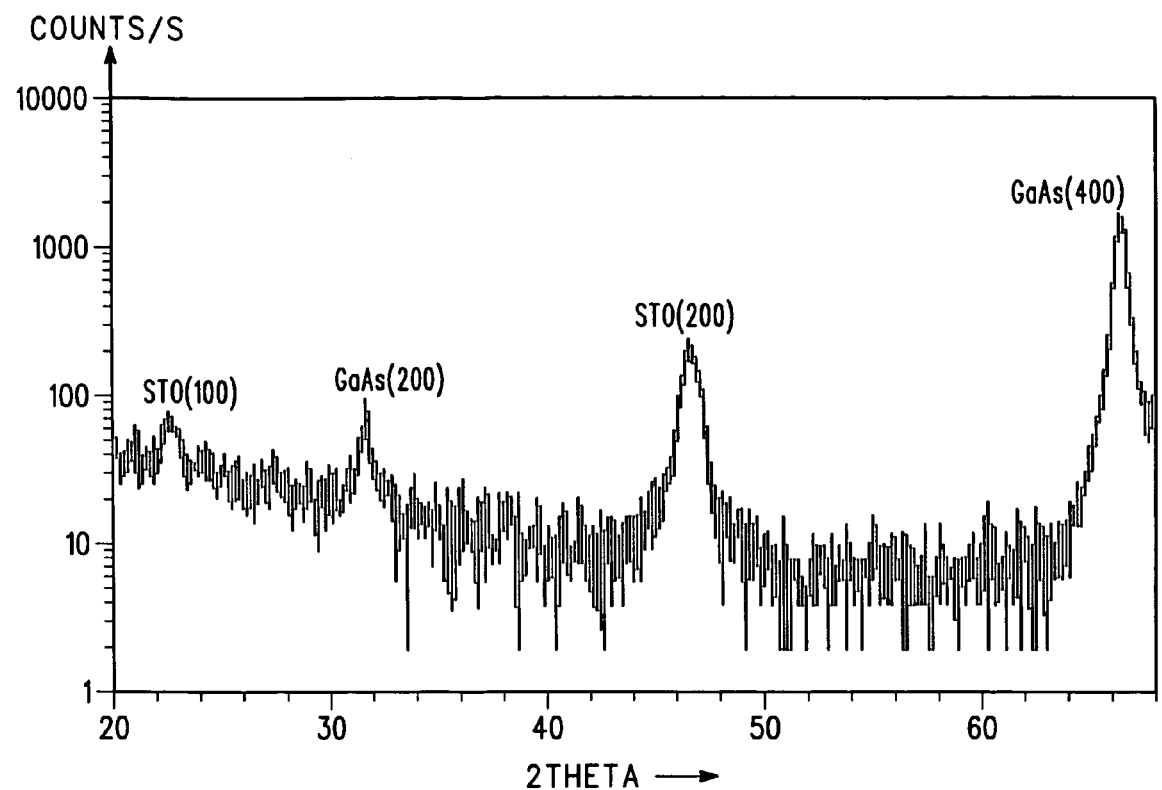
FIG. 6 illustrates an x-ray diffraction spectrum of a structure including a monocrystalline accommodating buffer layer.

FIG. 6 illustrates an x-ray diffraction spectrum taken on a structure including a GaAs monocrystalline layer 26 comprising GaAs grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The additional buffer layer 32 is formed overlying the template layer before the deposition of the monocrystalline material layer. If the buffer layer is a monocrystalline material comprising a compound semiconductor superlattice, such a superlattice can be deposited, by MBE for example, on the template described above. If instead the buffer layer is a monocrystalline material layer comprising a layer of germanium, the process above is modified to cap the strontium titanate monocrystalline layer with a final layer of either strontium or titanium and then by depositing germanium to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and monocrystalline layer 38 to a rapid thermal anneal process with a peak temperature of about 700° C. to about 1000° C. and a process time of about 5 seconds to about 10 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
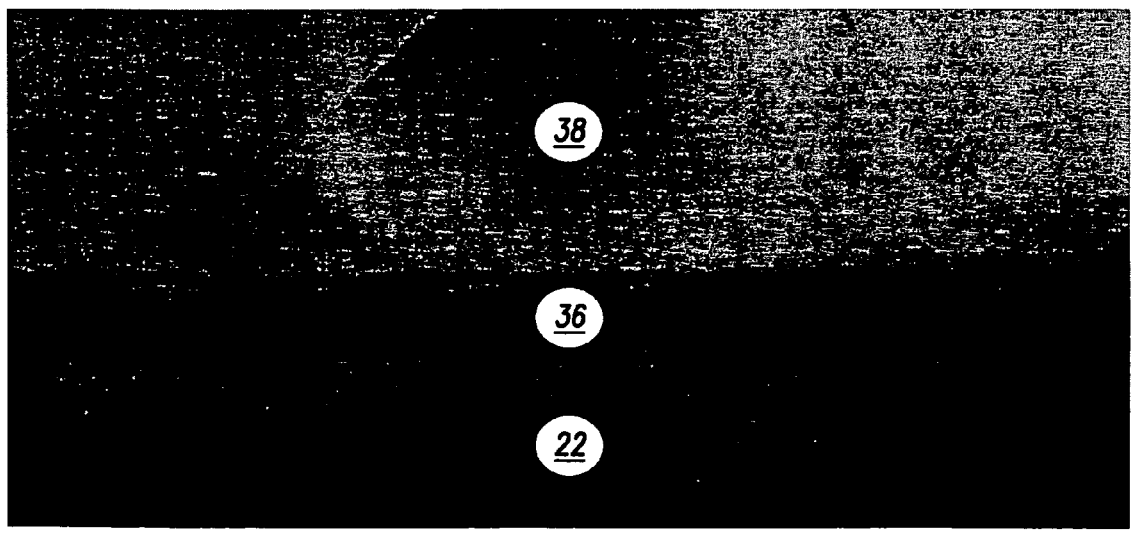
FIG. 7 illustrates a high resolution Transmission Electron Micrograph of a structure including an amorphous oxide layer.

FIG. 7 is a high resolution TEM of semiconductor material manufactured in accordance with the embodiment of the invention illustrated in FIG. 3. In accordance with this embodiment, a single crystal SrTiO$_3$ accommodating buffer layer was grown epitaxially on silicon substrate 22. During this growth process, an amorphous interfacial layer forms as described above. Next, additional monocrystalline layer 38 comprising a compound semiconductor layer of GaAs is formed above the accommodating buffer layer and the accommodating buffer layer is exposed to an anneal process to form amorphous oxide layer 36.

Figure 8:
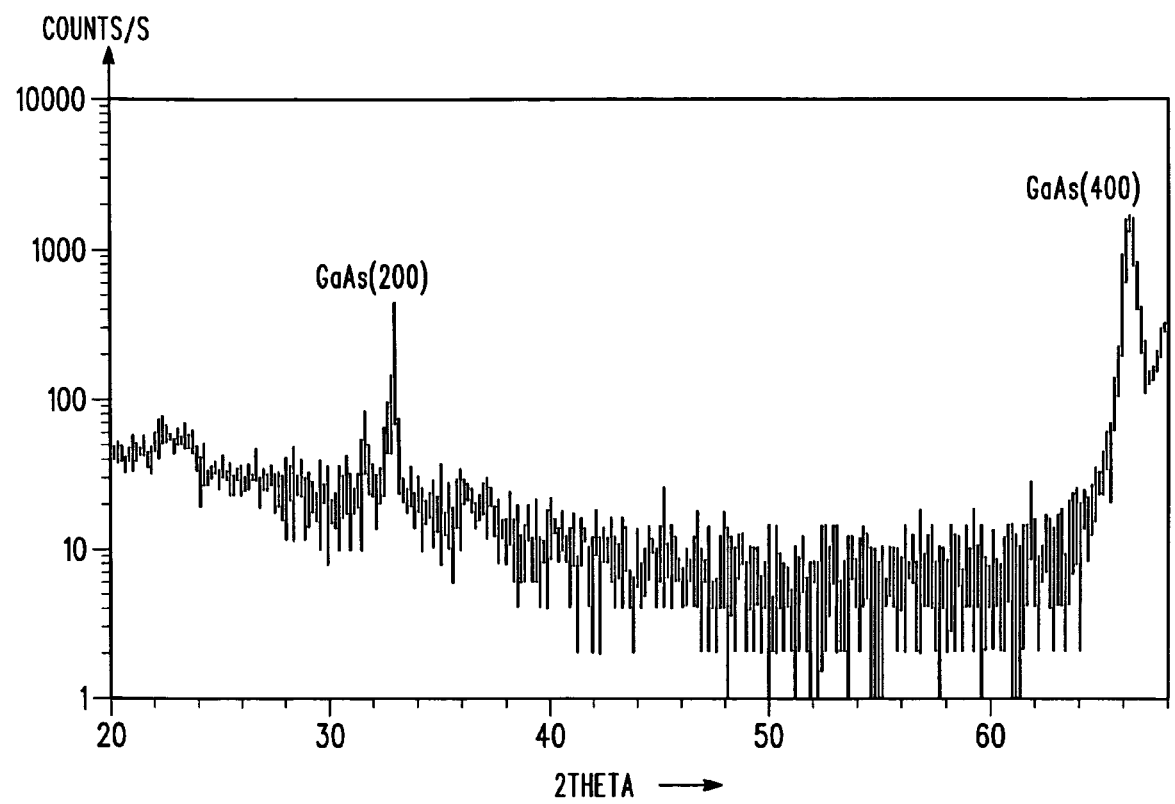
FIG. 8 illustrates an x-ray diffraction spectrum of a structure including an amorphous oxide layer.

FIG. 8 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other monocrystalline material layers comprising other III–V and II–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a monocrystalline material layer comprising compound semiconductors such as indium gallium arsenide, indium aluminum arsenide, or indium phosphide.

The formation of a device structure in accordance with another embodiment of the invention is illustrated schematically in cross-section in FIGS. 9–12. Like the previously described embodiments referred to in FIGS. 1–3, this embodiment of the invention involves the process of forming a compliant substrate utilizing the epitaxial growth of single crystal oxides, such as the formation of accommodating buffer layer 24 previously described with reference to FIGS. 1 and 2 and amorphous layer 36 previously described with reference to FIG. 3, and the formation of a template layer 30. However, the embodiment illustrated in FIGS. 9–12 utilizes a template that includes a surfactant to facilitate layer-by-layer monocrystalline material growth.

Figure 9:
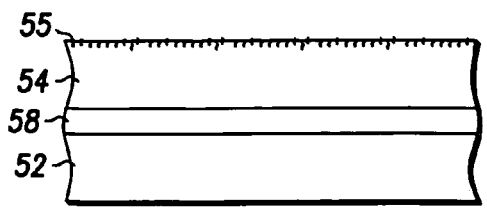
FIGS. 9–12 illustrate schematically, in cross-section, the formation of a device structure in accordance with another embodiment of the invention.

Turning now to FIG. 9, an amorphous intermediate layer 58 is grown on substrate 52 at the interface between substrate 52 and a growing accommodating buffer layer 54, which is preferably a monocrystalline crystal oxide layer, by the oxidation of substrate 52 during the growth of layer 54. Layer 54 is preferably a monocrystalline oxide material such as a monocrystalline layer of Sr$_z$Ba$_{1-z}$TiO$_3$ where z ranges from 0 to 1. However, layer 54 may also comprise any of those compounds previously described with reference layer 24 in FIGS. 1–2 and any of those compounds previously described with reference to layer 36 in FIG. 3 which is formed from layers 24 and 28 referenced in FIGS. 1 and 2.

Figure 10:
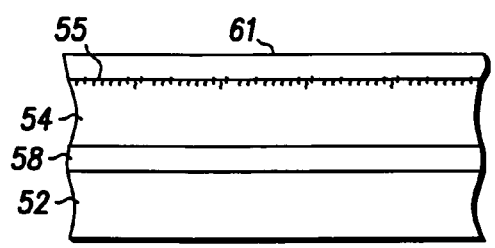
Figure 11:
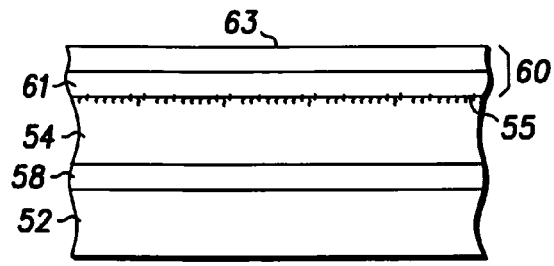

Layer 54 is grown with a strontium (Sr) terminated surface represented in FIG. 9 by hatched line 55 which is followed by the addition of a template layer 60 which includes a surfactant layer 61 and capping layer 63 as illustrated in FIGS. 10 and 11. Surfactant layer 61 may comprise, but is not limited to, elements such as Al, In and Ga, but will be dependent upon the composition of layer 54 and the overlying layer of monocrystalline material for optimal results. In one exemplary embodiment, aluminum (Al) is used for surfactant layer 61 and functions to modify the surface and surface energy of layer 54. Preferably, surfactant layer 61 is epitaxially grown, to a thickness of one to two monolayers, over layer 54 as illustrated in FIG. 10 by way of molecular beam epitaxy (MBE), although other epitaxial processes may also be performed including chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like.

Surfactant layer 61 is then exposed to a Group V element such as arsenic, for example, to form capping layer 63 as illustrated in FIG. 11. Surfactant layer 61 may be exposed to a number of materials to create capping layer 63 such as elements which include, but are not limited to, As, P, Sb and N. Surfactant layer 61 and capping layer 63 combine to form template layer 60.

Figure 12:
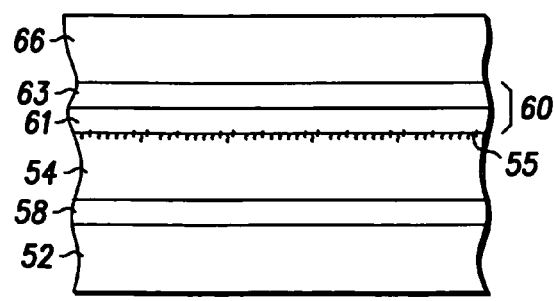

Monocrystalline material layer 66, which in this example is a compound semiconductor such as GaAs, is then deposited via MBE, CVD, MOCVD, MEE, ALE, PVD, CSD, PLD, and the like to form the final structure illustrated in FIG. 12.

FIGS. 13–16 illustrate possible molecular bond structures for a specific example of a compound semiconductor structure formed in accordance with the embodiment of the invention illustrated in FIGS. 9–12. More specifically, FIGS. 13–16 illustrate the growth of GaAs (layer 66) on the strontium terminated surface of a strontium titanate monocrystalline oxide (layer 54) using a surfactant containing template (layer 60).

The growth of a monocrystalline material layer 66 such as GaAs on an accommodating buffer layer 54 such as a strontium titanium oxide over amorphous interface layer 58 and substrate layer 52, both of which may comprise materials previously described with reference to layers 28 and 22, respectively in FIGS. 1 and 2, illustrates a critical thickness of about 1000 Angstroms where the two-dimensional (2D) and three-dimensional (3D) growth shifts because of the surface energies involved. In order to maintain a true layer by layer growth (Frank Van der Mere growth), the following relationship must be satisfied:

$$\delta_{STO} > (\delta_{INT} + \delta_{GaAs})$$

where the surface energy of the monocrystalline oxide layer 54 must be greater than the surface energy of the amorphous interface layer 58 added to the surface energy of the GaAs layer 66. Since it is impracticable to satisfy this equation, a surfactant containing template was used, as described above with reference to FIGS. 10–12, to increase the surface energy of the monocrystalline oxide layer 54 and also to shift the crystalline structure of the template to a diamond-like structure that is in compliance with the original GaAs layer.

Figure 13:
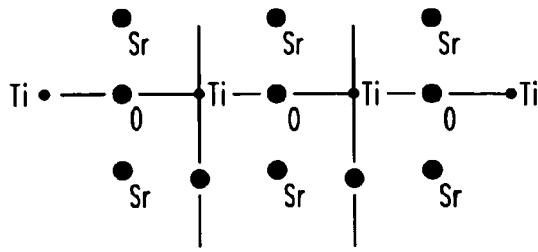
FIGS. 13–16 illustrate a probable molecular bonding structure of the device structures illustrated in FIGS. 9–12.
Figure 14:
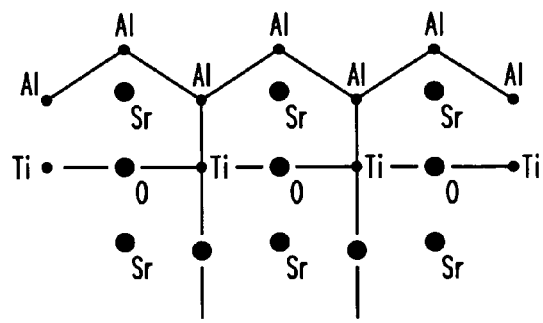
Figure 15:
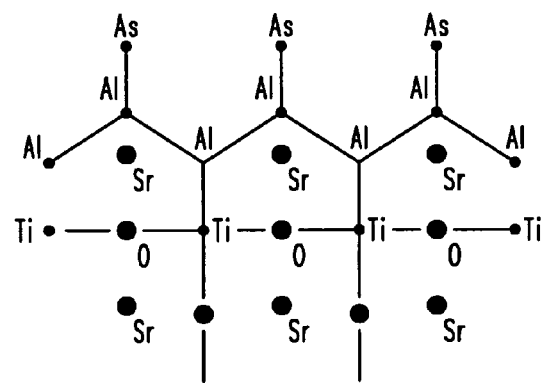
Figure 16:
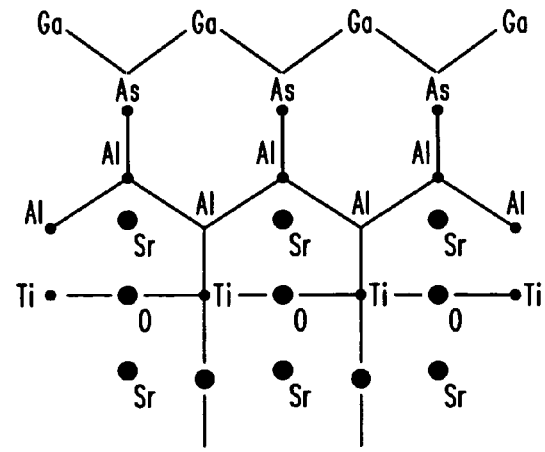

FIG. 13 illustrates the molecular bond structure of a strontium terminated surface of a strontium titanate monocrystalline oxide layer. An aluminum surfactant layer is deposited on top of the strontium terminated surface and bonds with that surface as illustrated in FIG. 14, which reacts to form a capping layer comprising a monolayer of $Al_2Sr$ having the molecular bond structure illustrated in FIG. 14 which forms a diamond-like structure with an $sp^3$ hybrid terminated surface that is compliant with compound semiconductors such as GaAs. The structure is then exposed to As to form a layer of AlAs as shown in FIG. 15. GaAs is then deposited to complete the molecular bond structure illustrated in FIG. 16 which has been obtained by 2D growth. The GaAs can be grown to any thickness for forming other semiconductor structures, devices, or integrated circuits. Alkaline earth metals such as those in Group IIA are those elements preferably used to form the capping surface of the monocrystalline oxide layer 54 because they are capable of forming a desired molecular structure with aluminum.

In this embodiment, a surfactant containing template layer aids in the formation of a compliant substrate for the monolithic integration of various material layers including those comprised of Group III–V compounds to form high quality semiconductor structures, devices and integrated circuits. For example, a surfactant containing template may be used for the monolithic integration of a monocrystalline material layer such as a layer comprising Germanium (Ge), for example, to form high efficiency photocells.

Turning now to FIGS. 17–20, the formation of a device structure in accordance with still another embodiment of the invention is illustrated in cross-section. This embodiment utilizes the formation of a compliant substrate which relies on the epitaxial growth of single crystal oxides on silicon followed by the epitaxial growth of single crystal silicon onto the oxide.

Figure 17:
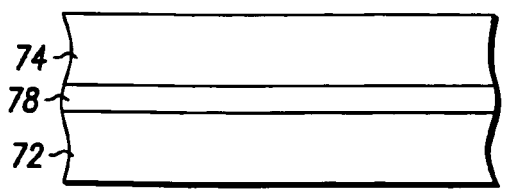
FIGS. 17–20 illustrate schematically, in cross-section, the formation of a device structure in accordance with still another embodiment of the invention.

An accommodating buffer layer 74 such as a monocrystalline oxide layer is first grown on a substrate layer 72, such as silicon, with an amorphous interface layer 78 as illustrated in FIG. 17. Monocrystalline oxide layer 74 may be comprised of any of those materials previously discussed with reference to layer 24 in FIGS. 1 and 2, while amorphous interface layer 78 is preferably comprised of any of those materials previously described with reference to the layer 28 illustrated in FIGS. 1 and 2. Substrate 72, although preferably silicon, may also comprise any of those materials previously described with reference to substrate 22 in FIGS. 1–3.

Figure 18:
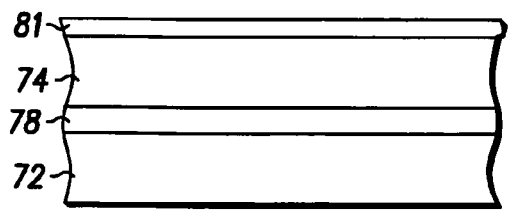

Next, a silicon layer 81 is deposited over monocrystalline oxide layer 74 via MBE, CVD, MOCVD, MEE, ALE, PVD, CSD, PLD, and the like as illustrated in FIG. 18 with a thickness of a few hundred Angstroms but preferably with a thickness of about 50 Angstroms. Monocrystalline oxide layer 74 preferably has a thickness of about 20 to 100 Angstroms.

Figure 19:
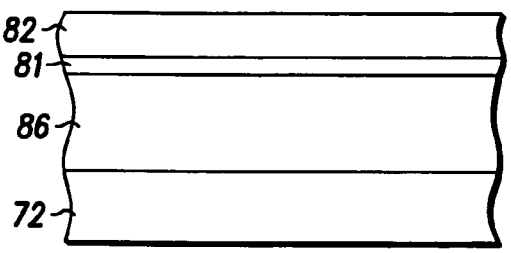
Figure 20:
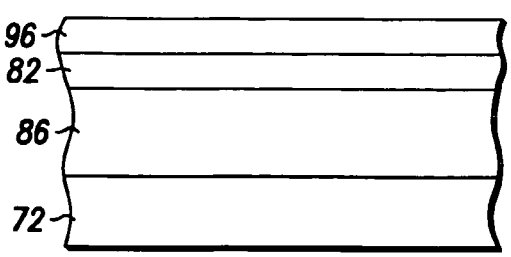

Rapid thermal annealing is then conducted in the presence of a carbon source such as acetylene or methane, for example at a temperature within a range of about 800° C. to 1000° C. to form capping layer 82 and silicate amorphous layer 86. However, other suitable carbon sources may be used as long as the rapid thermal annealing step functions to amorphize the monocrystalline oxide layer 74 into a silicate amorphous layer 86 and carbonize the top silicon layer 81 to form capping layer 82 which in this example would be a silicon carbide (SiC) layer as illustrated in FIG. 19. The formation of amorphous layer 86 is similar to the formation of layer 36 illustrated in FIG. 3 and may comprise any of those materials described with reference to layer 36 in FIG. 3 but the preferable material will be dependent upon the capping layer 82 used for silicon layer 81.

Finally, a compound semiconductor layer 96, such as gallium nitride (GaN) is grown over the SiC surface by way of MBE, CVD, MOCVD, MEE, ALE, PVD, CSD, PLD, or the like to form a high quality compound semiconductor material for device formation. More specifically, the deposition of GaN and GaN based systems such as GaInN and AlGaN will result in the formation of dislocation nets confined at the silicon/amorphous region. The resulting nitride containing compound semiconductor material may comprise elements from groups III, IV and V of the periodic table and is defect free.

Although GaN has been grown on SiC substrate in the past, this embodiment of the invention possesses a one step formation of the compliant substrate containing a SiC top surface and an amorphous layer on a Si surface. More specifically, this embodiment of the invention uses an intermediate single crystal oxide layer that is amorphosized to form a silicate layer which adsorbs the strain between the layers. Moreover, unlike past use of a SiC substrate, this embodiment of the invention is not limited by wafer size which is usually less than 50 mm in diameter for prior art SiC substrates.

The monolithic integration of nitride containing semiconductor compounds containing group III–V nitrides and silicon devices can be used for high temperature RF applications and optoelectronics. GaN systems have particular use in the photonic industry for the blue/green and UV light sources and detection. High brightness light emitting diodes (LEDs) and lasers may also be formed within the GaN system.

Figure 21:
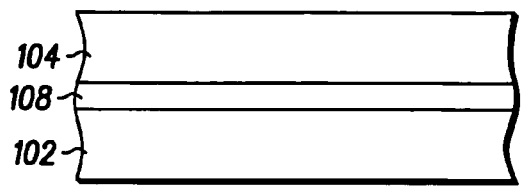
FIGS. 21–23 illustrate schematically, in cross-section, the formation of yet another embodiment of a device structure in accordance with the invention.
Figure 22:
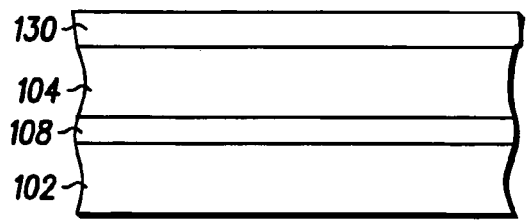
Figure 23:
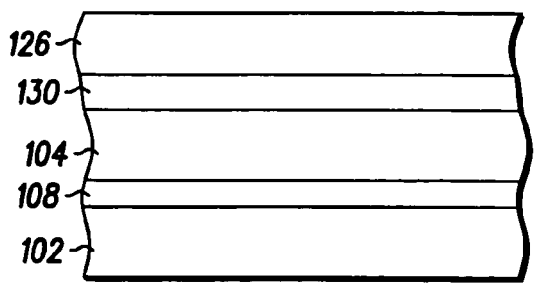

FIGS. 21–23 schematically illustrate, in cross-section, the formation of another embodiment of a device structure in accordance with the invention. This embodiment includes a compliant layer that functions as a transition layer that uses clathrate or Zintl type bonding. More specifically, this embodiment utilizes an intermetallic template layer to reduce the surface energy of the interface between material layers thereby allowing for two dimensional layer by layer growth.

The structure illustrated in FIG. 21 includes a monocrystalline substrate 102, an amorphous interface layer 108 and an accommodating buffer layer 104. Amorphous interface layer 108 is formed on substrate 102 at the interface between substrate 102 and accommodating buffer layer 104 as previously described with reference to FIGS. 1 and 2. Amorphous interface layer 108 may comprise any of those materials previously described with reference to amorphous interface layer 28 in FIGS. 1 and 2. Substrate 102 is preferably silicon but may also comprise any of those materials previously described with reference to substrate 22 in FIGS. 1–3.

A template layer 130 is deposited over accommodating buffer layer 104 as illustrated in FIG. 22 and preferably comprises a thin layer of Zintl type phase material composed of metals and metalloids having a great deal of ionic character. As in previously described embodiments, template layer 130 is deposited by way of MBE, CVD, MOCVD, MEE, ALE, PVD, CSD, PLD, or the like to achieve a thickness of one monolayer. Template layer 130 functions as a "soft" layer with non-directional bonding but high crystallinity which absorbs stress build up between layers having lattice mismatch. Materials for template 130 may include, but are not limited to, materials containing Si, Ga, In, and Sb such as, for example, $AlSr_2$, $(MgCaYb)Ga_2$, $(Ca,Sr,Eu,Yb)In_2$, $BaGe_2As$, and $SrSn_2As_2$.

A monocrystalline material layer 126 is epitaxially grown over template layer 130 to achieve the final structure illustrated in FIG. 23. As a specific example, an $SrAl_2$ layer may be used as template layer 130 and an appropriate monocrystalline material layer 126 such as a compound semiconductor material GaAs is grown over the $SrAl_2$. The Al—Ti (from the accommodating buffer layer of layer of $Sr_zBa_{1-z}TiO_3$ where z ranges from 0 to 1) bond is mostly metallic while the Al—As (from the GaAs layer) bond is weakly covalent. The Sr participates in two distinct types of bonding with part of its electric charge going to the oxygen atoms in the lower accommodating buffer layer 104 comprising $Sr_zBa_{1-z}TiO_3$ to participate in ionic bonding and the other part of its valence charge being donated to Al in a way that is typically carried out with Zintl phase materials. The amount of the charge transfer depends on the relative electronegativity of elements comprising the template layer 130 as well as on the interatomic distance. In this example, Al assumes an $sp^3$ hybridization and can readily form bonds with monocrystalline material layer 126, which in this example, comprises compound semiconductor material GaAs.

The compliant substrate produced by use of the Zintl type template layer used in this embodiment can absorb a large strain without a significant energy cost. In the above example, the bond strength of the Al is adjusted by changing the volume of the $SrAl_2$ layer thereby making the device tunable for specific applications which include the monolithic integration of III–V and Si devices and the monolithic integration of high-k dielectric materials for CMOS technology.

Clearly, those embodiments specifically describing structures having compound semiconductor portions and Group IV semiconductor portions, are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials as well as other material layers that are used to form those devices with other components that work better or are easily and/or inexpensively formed within semiconductor or compound semiconductor materials. This allows a device to be shrunk, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, a relatively inexpensive "handle" wafer overcomes the fragile nature of compound semiconductor or other monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g. conventional compound semiconductor wafers).

Figure 24:
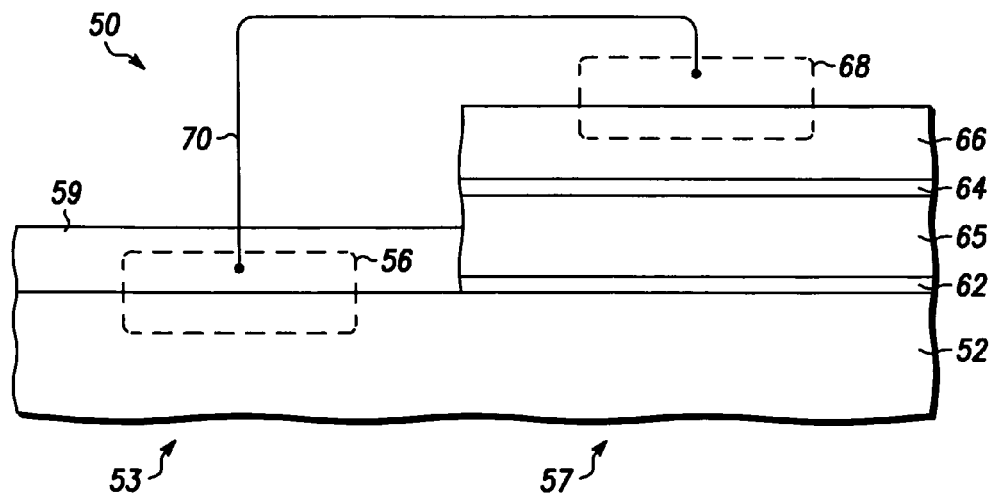
FIGS. 24, 25 illustrate schematically, in cross section, device structures that can be used in accordance with various embodiments of the invention.

FIG. 24 illustrates schematically, in cross section, a device structure 50 in accordance with a further embodiment. Device structure 50 includes a monocrystalline semiconductor substrate 52, preferably a monocrystalline silicon wafer. Monocrystalline semiconductor substrate 52 includes two regions, 53 and 57. An electrical semiconductor component generally indicated by the dashed line 56 is formed, at least partially, in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 59 such as a layer of silicon dioxide or the like may overlie electrical semiconductor component 56.

Insulating material 59 and any other layers that may have been formed or deposited during the processing of semiconductor component 56 in region 53 are removed from the surface of region 57 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 57 and is reacted with the oxidized surface to form a first template layer (not shown). In accordance with one embodiment, a monocrystalline oxide layer is formed overlying the template layer by a process of molecular beam epitaxy. Reactants including barium, titanium and oxygen are deposited onto the template layer to form the monocrystalline oxide layer. Initially during the deposition the partial pressure of oxygen is kept near the minimum necessary to fully react with the barium and titanium to form monocrystalline barium titanate layer. The partial pressure of oxygen is then increased to provide an overpressure of oxygen and to allow oxygen to diffuse through the growing monocrystalline oxide layer. The oxygen diffusing through the barium titanate reacts with silicon at the surface of region 57 to form an amorphous layer of silicon oxide 62 on second region 57 and at the interface between silicon substrate 52 and the monocrystalline oxide layer 65. Layers 65 and 62 may be subject to an annealing process as described above in connection with FIG. 3 to form a single amorphous accommodating layer.

In accordance with an embodiment, the step of depositing the monocrystalline oxide layer 65 is terminated by depositing a second template layer 64, which can be 1–10 monolayers of titanium, barium, barium and oxygen, or titanium and oxygen. A layer 66 of a monocrystalline compound semiconductor material is then deposited overlying second template layer 64 by a process of molecular beam epitaxy. The deposition of layer 66 is initiated by depositing a layer of arsenic onto template 64. This initial step is followed by depositing gallium and arsenic to form monocrystalline gallium arsenide 66. Alternatively, strontium can be substituted for barium in the above example.

In accordance with a further embodiment, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in silicon substrate 52 and one device formed in monocrystalline compound semiconductor material layer 66. Although illustrative structure 50 has been described as a structure formed on a silicon substrate 52 and having a barium (or strontium) titanate layer 65 and a gallium arsenide layer 66, similar devices can be fabricated using other substrates, monocrystalline oxide layers and other compound semiconductor layers as described elsewhere in this disclosure.

Figure 25:
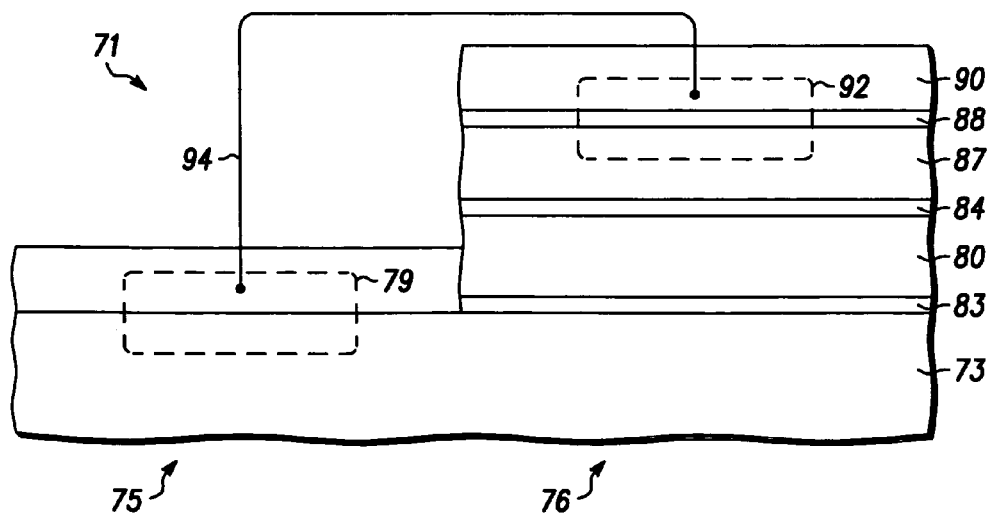

FIG. 25 illustrates a semiconductor structure 71 in accordance with a further embodiment. Structure 71 includes a monocrystalline semiconductor substrate 73 such as a monocrystalline silicon wafer that includes a region 75 and a region 76. An electrical component schematically illustrated by the dashed line 79 is formed in region 75 using conventional silicon device processing techniques commonly used in the semiconductor industry. Using process steps similar to those described above, a monocrystalline oxide layer 80 and an intermediate amorphous silicon oxide layer 83 are formed overlying region 76 of substrate 73. A template layer 84 and subsequently a monocrystalline semiconductor layer 87 are formed overlying monocrystalline oxide layer 80. In accordance with a further embodiment, an additional monocrystalline oxide layer 88 is formed overlying layer 87 by process steps similar to those used to form layer 80, and an additional monocrystalline semiconductor layer 90 is formed overlying monocrystalline oxide layer 88 by process steps similar to those used to form layer 87. In accordance with one embodiment, at least one of layers 87 and 90 are formed from a compound semiconductor material. Layers 80 and 83 may be subject to an annealing process as described above in connection with FIG. 3 to form a single amorphous accommodating layer.

A semiconductor component generally indicated by a dashed line 92 is formed at least partially in monocrystalline semiconductor layer 87. In accordance with one embodiment, semiconductor component 92 may include a field effect transistor having a gate dielectric formed, in part, by monocrystalline oxide layer 88. In addition, monocrystalline semiconductor layer 90 can be used to implement the gate electrode of that field effect transistor. In accordance with one embodiment, monocrystalline semiconductor layer 87 is formed from a group III–V compound and semiconductor component 92 is a radio frequency amplifier that takes advantage of the high mobility characteristic of group III–V component materials. In accordance with yet a further embodiment, an electrical interconnection schematically illustrated by the line 94 electrically interconnects component 79 and component 92. Structure 71 thus integrates components that take advantage of the unique properties of the two monocrystalline semiconductor materials.

Attention is now directed to a method for forming exemplary portions of illustrative composite semiconductor structures or composite integrated circuits like 50 or 71. In particular, the illustrative composite semiconductor structure or integrated circuit 103 shown in FIGS. 26–30 includes a compound semiconductor portion 1022, a bipolar portion 1024, and a MOS portion 1026. In FIG. 26, a p-type doped, monocrystalline silicon substrate 110 is provided having a compound semiconductor portion 1022, a bipolar portion 1024, and an MOS portion 1026. Within bipolar portion 1024, the monocrystalline silicon substrate 110 is doped to form an N$^+$ buried region 1102. A lightly p-type doped epitaxial monocrystalline silicon layer 1104 is then formed over the buried region 1102 and the substrate 110. A doping step is then performed to create a lightly n-type doped drift region 1117 above the N$^+$ buried region 1102. The doping step converts the dopant type of the lightly p-type epitaxial layer within a section of the bipolar region 1024 to a lightly n-type monocrystalline silicon region. A field isolation region 1106 is then formed between and around the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall spacers 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form N$^+$ doped regions 1116 and the emitter region 1120. N$^+$ doped regions 1116 are formed within layer 1104 along adjacent sides of the gate electrode 1112 and are source, drain, or source/drain regions for the MOS transistor. The N$^+$ doped regions 1116 and emitter region 1120 have a doping concentration of at least 1E19 atoms per cubic centimeter to allow ohmic contacts to be formed. A p-type doped region is formed to create the inactive or extrinsic base region 1118 which is a P$^+$ doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. Although illustrated with a NPN bipolar transistor and a N-channel MOS transistor, device structures and circuits in accordance with various embodiments may additionally or alternatively include other electronic devices formed using the silicon substrate. As of this point, no circuitry has been formed within the compound semiconductor portion 1022.

After the silicon devices are formed in regions 1024 and 1026, a protective layer 1122 is formed overlying devices in regions 1024 and 1026 to protect devices in regions 1024 and 1026 from potential damage resulting from device formation in region 1022. Layer 1122 may be formed of, for example, an insulating material such as silicon oxide or silicon nitride.

All of the layers that have been formed during the processing of the bipolar and MOS portions of the integrated circuit, except for epitaxial layer 1104 but including protective layer 1122, are now removed from the surface of compound semiconductor portion 1022. A bare silicon surface is thus provided for the subsequent processing of this portion, for example in the manner set forth above.

An accommodating buffer layer 124 is then formed over the substrate 110 as illustrated in FIG. 27. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 5–15 nm thick. During the formation of the accommodating buffer layer, an amorphous intermediate layer 122 is formed along the uppermost silicon surfaces of the integrated circuit 103. This amorphous intermediate layer 122 typically includes an oxide of silicon and has a thickness and range of approximately 1–5 nm. In one particular embodiment, the thickness is approximately 2 nm. Following the formation of the accommodating buffer layer 124 and the amorphous intermediate layer 122, a template layer 125 is then formed and has a thickness in a range of approximately one to ten monolayers of a material. In one particular embodiment, the material includes titanium-arsenic, strontium-oxygen-arsenic, or other similar materials as previously described with respect to FIGS. 1–5.

A monocrystalline compound semiconductor layer 132 is then epitaxially grown overlying the monocrystalline portion of accommodating buffer layer 124 (as shown in FIG. 28. The portion of layer 132 that is grown over portions of layer 124 that are not monocrystalline may be polycrystalline or amorphous. The compound semiconductor layer can be formed by a number of methods and typically includes a material such as gallium arsenide, aluminum gallium arsenide, indium phosphide, or other compound semiconductor materials as previously mentioned. The thickness of the layer is in a range of approximately 1–5,000 nm, and more preferably 100–2000 nm. Furthermore, additional monocrystalline layers may be formed above layer 132, as discussed in more detail below in connection with FIGS. 31–32.

In this particular embodiment, each of the elements within the template layer are also present in the accommodating buffer layer 124, the monocrystalline compound semiconductor material 132, or both. Therefore, the delineation between the template layer 125 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

After at least a portion of layer 132 is formed in region 1022, layers 122 and 124 may be subject to an annealing process as described above in connection with FIG. 3 to form a single amorphous accommodating layer. If only a portion of layer 132 is formed prior to the anneal process, the remaining portion may be deposited onto structure 103 prior to further processing.

Figure 29:
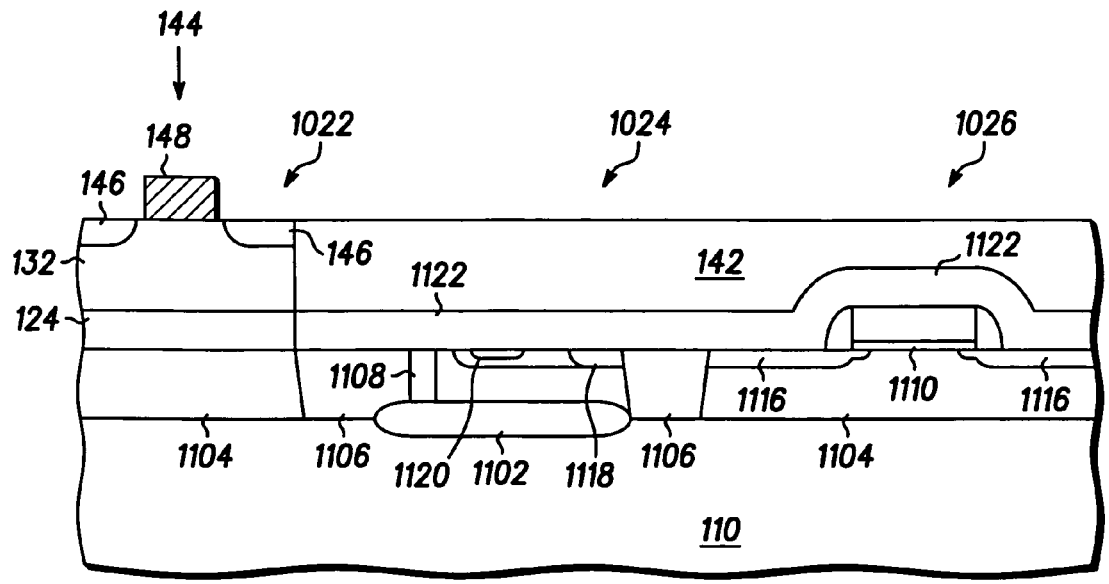

At this point in time, sections of the compound semiconductor layer 132 and the accommodating buffer layer 124 (or of the amorphous accommodating layer if the annealing process described above has been carried out) are removed from portions overlying the bipolar portion 1024 and the MOS portion 1026 as shown in FIG. 29. After the section of the compound semiconductor layer and the accommodating buffer layer 124 are removed, an insulating layer 142 is formed over protective layer 1122. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished or etched to remove portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and at least a portion of monocrystalline compound semiconductor layer 132 are also n-type doped. If a p-type MESFET were to be formed, then the doped regions 146 and at least a portion of monocrystalline compound semiconductor layer 132 would have just the opposite doping type. The heavier doped (N$^+$) regions 146 allow ohmic contacts to be made to the monocrystalline compound semiconductor layer 132. At this point in time, the active devices within the integrated circuit have been formed. Although not illustrated in the drawing figures, additional processing steps such as formation of well regions, threshold adjusting implants, channel punchthrough prevention implants, field punchthrough prevention implants, and the like may be performed in accordance with the present invention. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETs, and combinations of vertical and planar transistors, can be used. Also, other electrical components, such as resistors, capacitors, diodes, and the like, may be formed in one or more of the portions 1022, 1024, and 1026.

Figure 30:
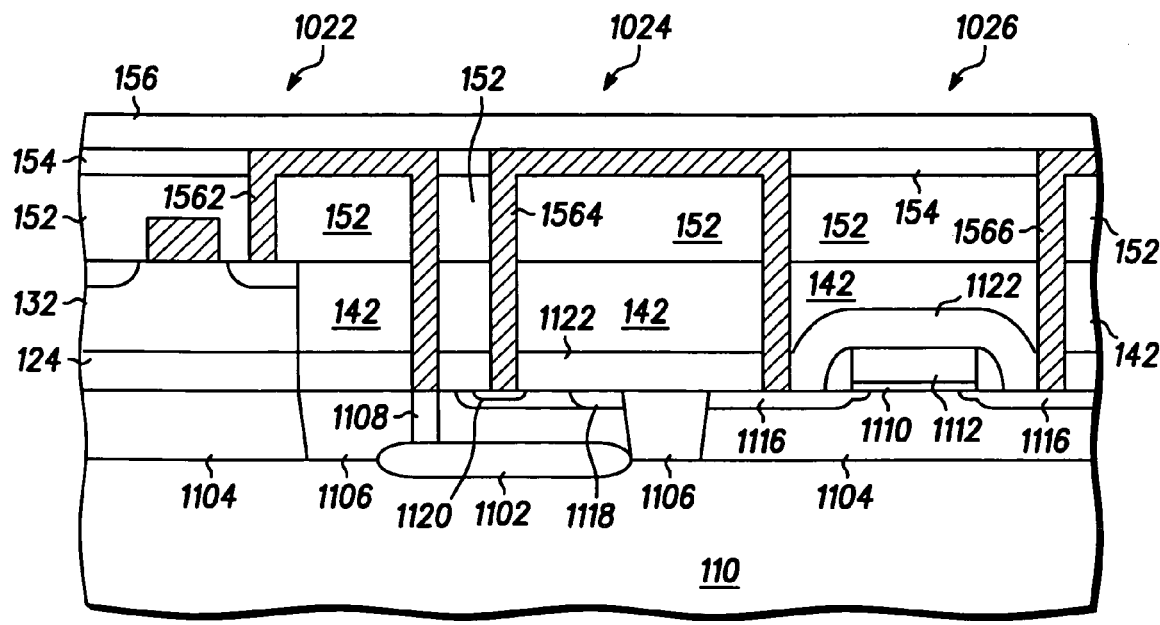

Processing continues to form a substantially completed integrated circuit 103 as illustrated in FIG. 30. An insulating layer 152 is formed over the substrate 110. The insulating layer 152 may include an etch-stop or polish-stop region that is not illustrated in FIG. 30. A second insulating layer 154 is then formed over the first insulating layer 152. Portions of layers 154, 152, 142, 124, and 1122 are removed to define contact openings where the devices are to be interconnected. Interconnect trenches are formed within insulating layer 154 to provide the lateral connections between the contacts. As illustrated in FIG. 30, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown. Similar electrical connections are also formed to couple regions 1118 and 1112 to other regions of the integrated circuit.

A passivation layer 156 is formed over the interconnects 1562, 1564, and 1566 and insulating layer 154. Other electrical connections are made to the transistors as illustrated as well as to other electrical or electronic components within the integrated circuit 103 but are not illustrated in the FIGS. Further, additional insulating layers and interconnects may be formed as necessary to form the proper interconnections between the various components within the integrated circuit 103.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion 1024 into the compound semiconductor portion 1022 or the MOS portion 1026. Therefore, the requirement of special fabricating steps solely used for making a bipolar transistor can be eliminated. Therefore, there would only be a compound semiconductor portion and a MOS portion to the integrated circuit.

In still another embodiment, an integrated circuit can be formed such that it includes an optical laser in a compound semiconductor portion and an optical interconnect (waveguide) to a MOS transistor within a Group IV semiconductor region of the same integrated circuit. FIGS. 31–37 include illustrations of one embodiment.

Figure 31:
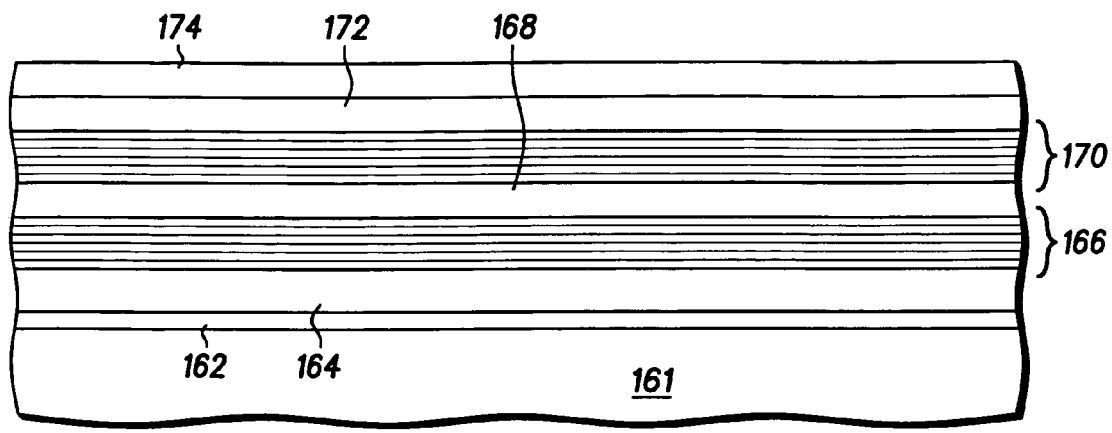
FIGS. 31–37 include illustrations of cross-sectional views of a portion of another integrated circuit that includes a semiconductor laser and a MOS transistor in accordance with what is shown herein.

FIG. 31 includes an illustration of a cross-section view of a portion of an integrated circuit 160 that includes a monocrystalline silicon wafer 161. An amorphous intermediate layer 162 and an accommodating buffer layer 164, similar to those previously described, have been formed over wafer 161. Layers 162 and 164 may be subject to an annealing process as described above in connection with FIG. 3 to form a single amorphous accommodating layer. In this specific embodiment, the layers needed to form the optical laser will be formed first, followed by the layers needed for the MOS transistor. In FIG. 31, the lower mirror layer 166 includes alternating layers of compound semiconductor materials. For example, the first, third, and fifth films within the optical laser may include a material such as gallium arsenide, and the second, fourth, and sixth films within the lower mirror layer 166 may include aluminum gallium arsenide or vice versa. Layer 168 includes the active region that will be used for photon generation. Upper mirror layer 170 is formed in a similar manner to the lower mirror layer 166 and includes alternating films of compound semiconductor materials. In one particular embodiment, the upper mirror layer 170 may be p-type doped compound semiconductor materials, and the lower mirror layer 166 may be n-type doped compound semiconductor materials.

Another accommodating buffer layer 172, similar to the accommodating buffer layer 164, is formed over the upper mirror layer 170. In an alternative embodiment, the accommodating buffer layers 164 and 172 may include different materials. However, their function is essentially the same in that each is used for making a transition between a compound semiconductor layer and a monocrystalline Group IV semiconductor layer. Layer 172 may be subject to an annealing process as described above in connection with FIG. 3 to form an amorphous accommodating layer. A monocrystalline Group IV semiconductor layer 174 is formed over the accommodating buffer layer 172. In one particular embodiment, the monocrystalline Group IV semiconductor layer 174 includes germanium, silicon germanium, silicon germanium carbide, or the like.

Figure 32:
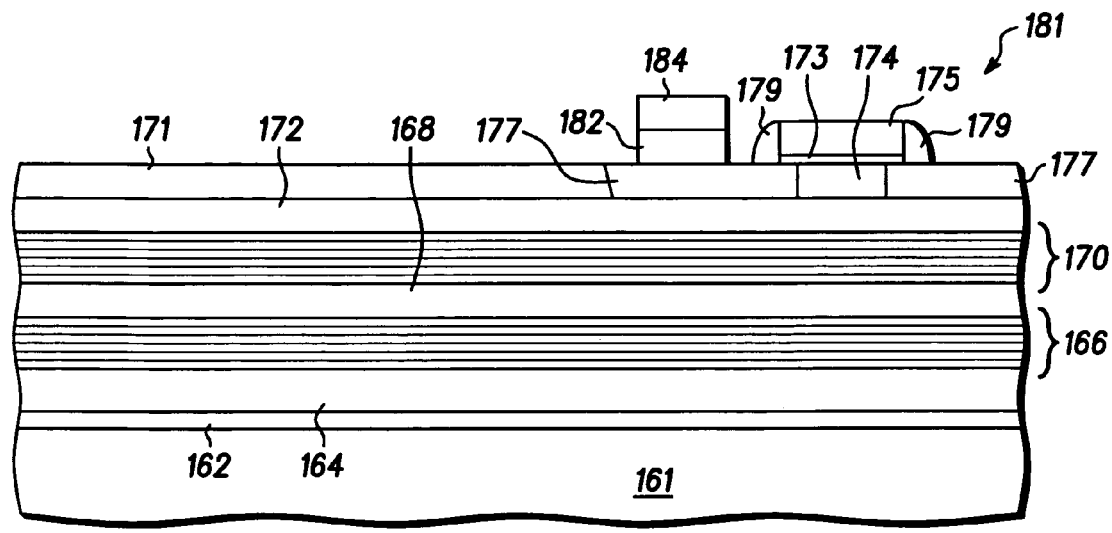

In FIG. 32, the MOS portion is processed to form electrical components within this upper monocrystalline Group IV semiconductor layer 174. As illustrated in FIG. 32, a field isolation region 171 is formed from a portion of layer 174. A gate dielectric layer 173 is formed over the layer 174, and a gate electrode 175 is formed over the gate dielectric layer 173. Doped regions 177 are source, drain, or source/drain regions for the transistor 181, as shown. Sidewall spacers 179 are formed adjacent to the vertical sides of the gate electrode 175. Other components can be made within at least a part of layer 174. These other components include other transistors (n-channel or p-channel), capacitors, transistors, diodes, and the like.

A monocrystalline Group IV semiconductor layer is epitaxially grown over one of the doped regions 177. An upper portion 184 is P+ doped, and a lower portion 182 remains substantially intrinsic (undoped) as illustrated in FIG. 32. The layer can be formed using a selective epitaxial process. In one embodiment, an insulating layer (not shown) is formed over the transistor 181 and the field isolation region 171. The insulating layer is patterned to define an opening that exposes one of the doped regions 177. At least initially, the selective epitaxial layer is formed without dopants. The entire selective epitaxial layer may be intrinsic, or a p-type dopant can be added near the end of the formation of the selective epitaxial layer. If the selective epitaxial layer is intrinsic, as formed, a doping step may be formed by implantation or by furnace doping. Regardless how the P+ upper portion 184 is formed, the insulating layer is then removed to form the resulting structure shown in FIG. 32.

Figure 33:
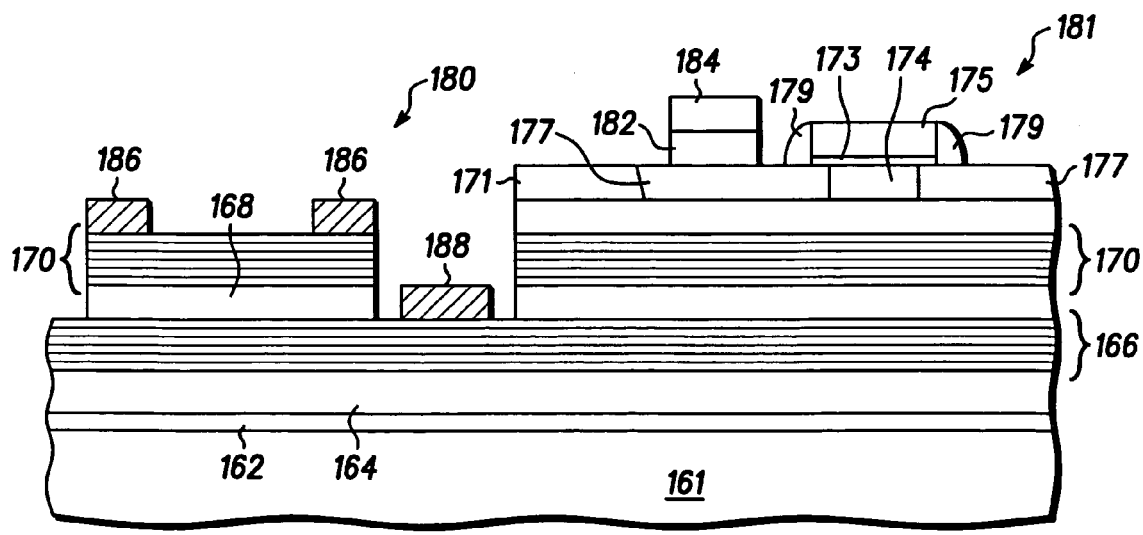

The next set of steps is performed to define the optical laser 180 as illustrated in FIG. 33. The field isolation region 171 and the accommodating buffer layer 172 are removed over the compound semiconductor portion of the integrated circuit. Additional steps are performed to define the upper mirror layer 170 and active layer 168 of the optical laser 180.

The sides of the upper mirror layer 170 and active layer 168 are substantially coterminous.

Contacts 186 and 188 are formed for making electrical contact to the upper mirror layer 170 and the lower mirror layer 166, respectively, as shown in FIG. 33. Contact 186 has an annular shape to allow light (photons) to pass out of the upper mirror layer 170 into a subsequently formed optical waveguide.

Figure 34:
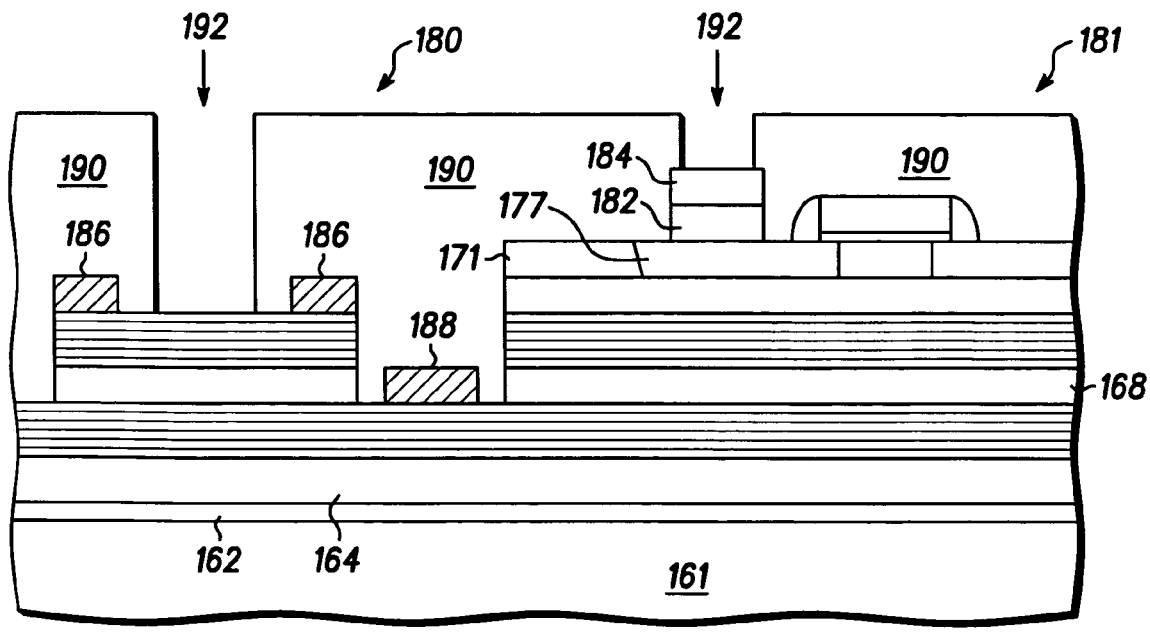
Figure 35:
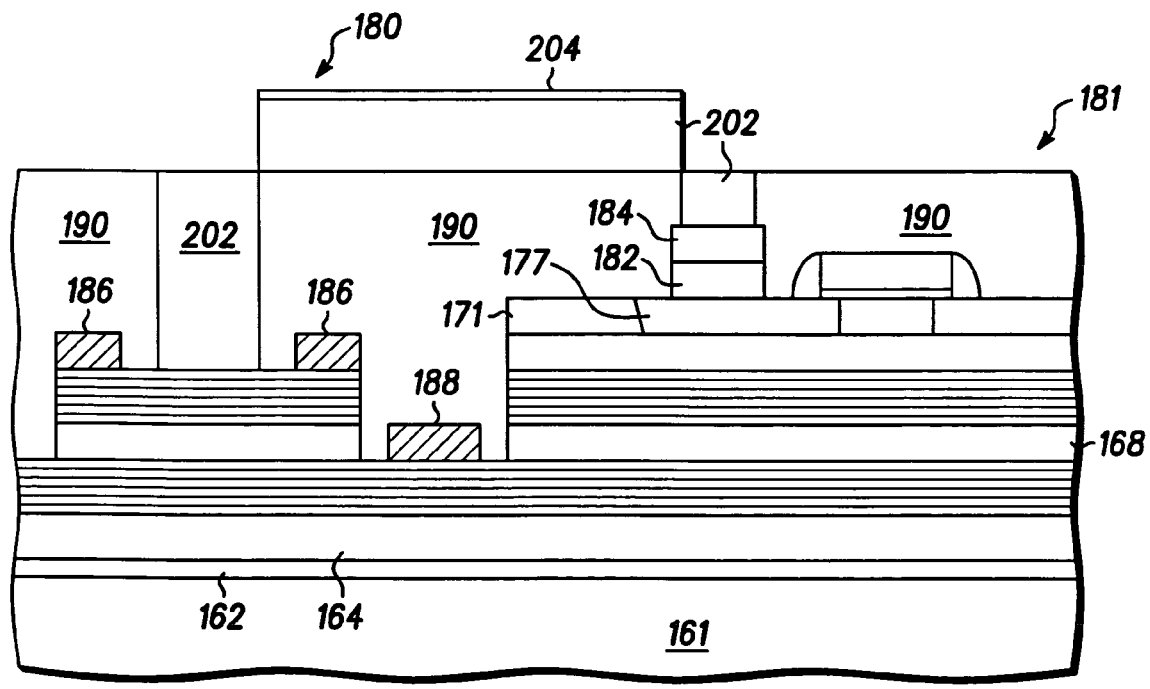

An insulating layer 190 is then formed and patterned to define optical openings extending to the contact layer 186 and one of the doped regions 177 as shown in FIG. 34. The insulating material can be any number of different materials, including an oxide, nitride, oxynitride, low-k dielectric, or any combination thereof. After defining the openings 192, a higher refractive index material 202 is then formed within the openings to fill them and to deposit the layer over the insulating layer 190 as illustrated in FIG. 35. With respect to the higher refractive index material 202, "higher" is in relation to the material of the insulating layer 190 (i.e., material 202 has a higher refractive index compared to the insulating layer 190). Optionally, a relatively thin lower refractive index film (not shown) could be formed before forming the higher refractive index material 202. A hard mask layer 204 is then formed over the high refractive index layer 202. Portions of the hard mask layer 204, and high refractive index layer 202 are removed from portions overlying the opening and to areas closer to the sides of FIG. 35.

Figure 36:
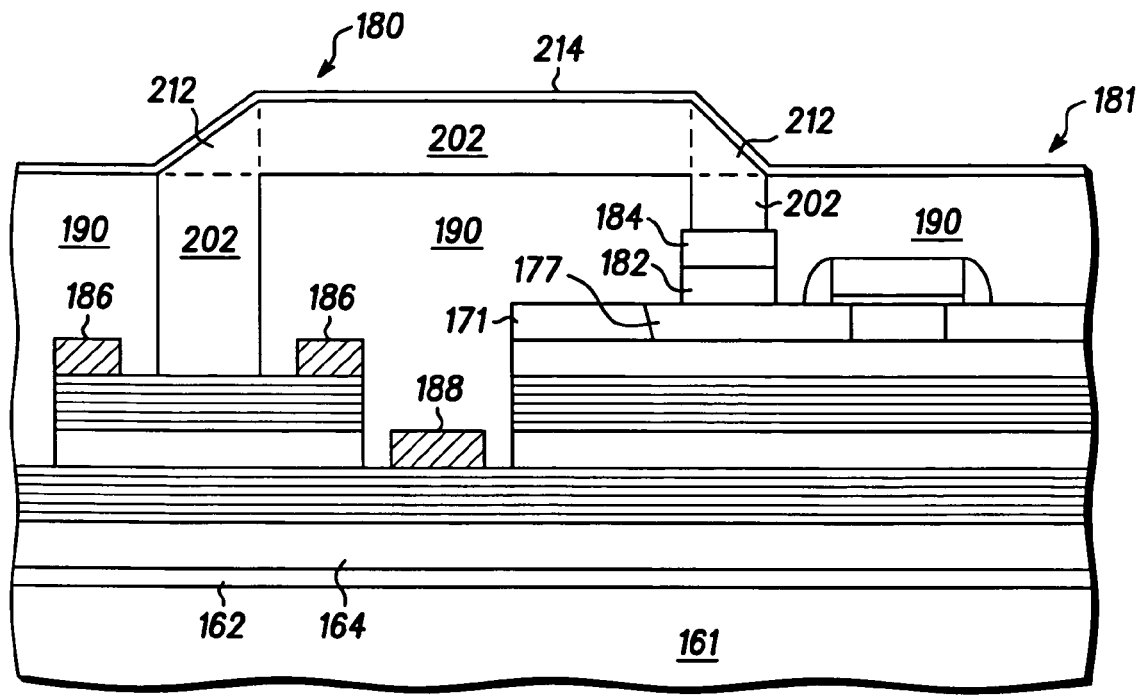

The balance of the formation of the optical waveguide, which is an optical interconnect, is completed as illustrated in FIG. 36. A deposition procedure (possibly a dep-etch process) is performed to effectively create sidewalls sections 212. In this embodiment, the sidewall sections 212 are made of the same material as material 202. The hard mask layer 204 is then removed, and a low refractive index layer 214 (low relative to material 202 and layer 212) is formed over the higher refractive index material 212 and 202 and exposed portions of the insulating layer 190. The dash lines in FIG. 36 illustrate the border between the high refractive index materials 202 and 212. This designation is used to identify that both are made of the same material but are formed at different times.

Figure 37:
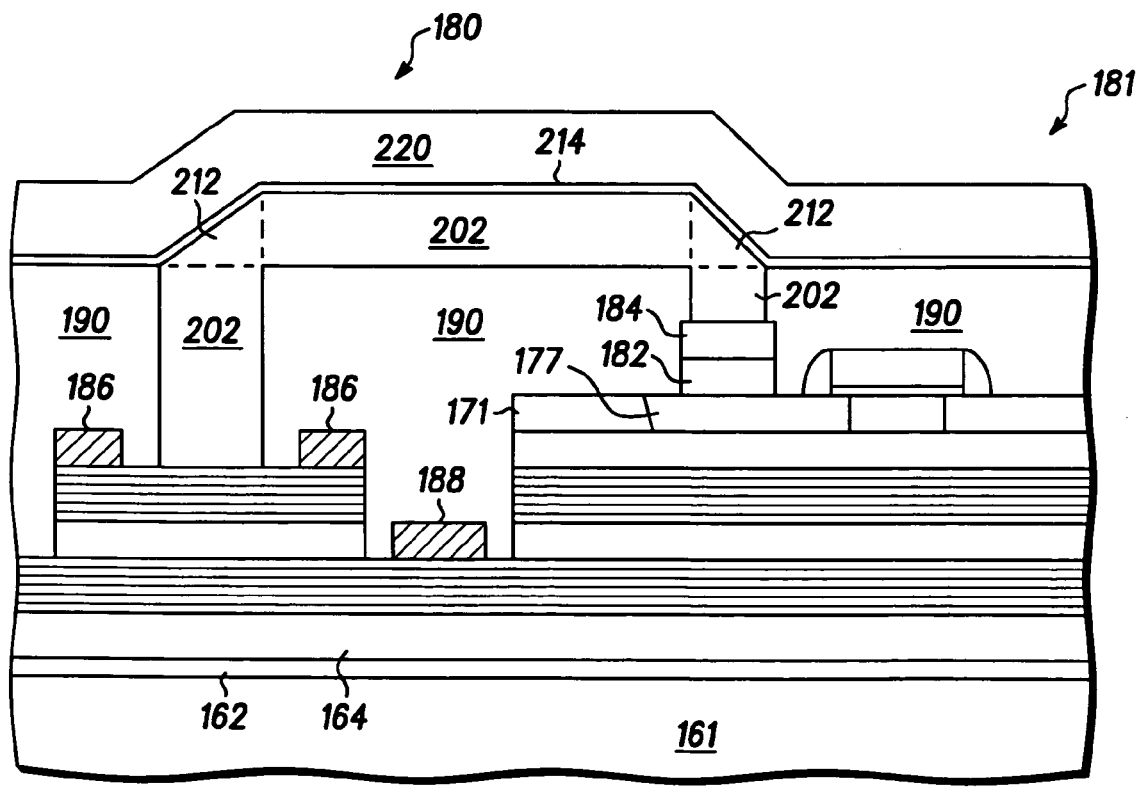

Processing is continued to form a substantially completed integrated circuit as illustrated in FIG. 37. A passivation layer 220 is then formed over the optical laser 180 and MOSFET transistor 181. Although not shown, other electrical or optical connections are made to the components within the integrated circuit but are not illustrated in FIG. 37. These interconnects can include other optical waveguides or may include metallic interconnects.

In other embodiments, other types of lasers can be formed. For example, another type of laser can emit light (photons) horizontally instead of vertically. If light is emitted horizontally, the MOSFET transistor could be formed within the substrate 161, and the optical waveguide would be reconfigured, so that the laser is properly coupled (optically connected) to the transistor. In one specific embodiment, the optical waveguide can include at least a portion of the accommodating buffer layer. Other configurations are possible.

Clearly, these embodiments of integrated circuits having compound semiconductor portions and Group IV semiconductor portions, are meant to illustrate what can be done and are not intended to be exhaustive of all possibilities or to limit what can be done. There is a multiplicity of other possible combinations and embodiments. For example, the compound semiconductor portion may include light emitting diodes, photodetectors, diodes, or the like, and the Group IV semiconductor can include digital logic, memory arrays, and most structures that can be formed in conventional MOS integrated circuits. By using what is shown and described herein, it is now simpler to integrate devices that work better in compound semiconductor materials with other components that work better in Group IV semiconductor materials. This allows a device to be shrunk, the manufacturing costs to decrease, and yield and reliability to increase.

Although not illustrated, a monocrystalline Group IV wafer can be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within III–V or II–VI semiconductor materials over a wafer of at least approximately 200 millimeters in diameter and possibly at least approximately 300 millimeters.

By the use of this type of substrate, a relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material. Fabrication costs for compound semiconductor devices should decrease because larger substrates can be processed more economically and more readily, compared to the relatively smaller and more fragile, conventional compound semiconductor wafers.

A composite integrated circuit may include components that provide electrical isolation when electrical signals are applied to the composite integrated circuit. The composite integrated circuit may include a pair of optical components, such as an optical source component and an optical detector component. An optical source component may be a light generating semiconductor device, such as an optical laser (e.g., the optical laser illustrated in FIG. 33), a photo emitter, a diode, etc. An optical detector component may be a light-sensitive semiconductor junction device, such as a photodetector, a photodiode, a bipolar junction, a transistor, etc.

A composite integrated circuit may include components to detect an object such as a person, a car, a plane, etc. The composite integrated circuit generally includes a source component, a receiver component, and an interconnect. The source component such as, but not limited to, a radio frequency (RF) transmitter (e.g., an RF voltage controlled oscillator) and an optical source component, generates an electromagnetic energy transmission. The electromagnetic energy transmission may be, but is not limited to, an electromagnetic energy transmission in one of the radio, microwave, infrared, visible light and ultraviolet spectrums. The interconnect guides the electromagnetic energy transmission from the source component to an antenna coupled with the interconnect. In addition, the interconnect may guide a portion of the electromagnetic energy transmission from the source component to the receiver component as a reference signal, which is further described below. The interconnect may be, but is not limited to, a dielectric material (i.e., an optical waveguide) and a metallic material. Furthermore, the interconnect may comprise a single interconnect (e.g., a single optical waveguide) or a plurality of interconnects. The antenna transmits the electromagnetic energy transmission. If there is an object then the antenna may receive a reflection of the electromagnetic energy transmission off of the object. Accordingly, the interconnect guides the reflection of the electromagnetic energy transmission from the antenna to the receiver component, which may be, but is not limited to, an optical detector component and an RF receiver (e.g., a mixer and a frequency modulated (FM) detector as one of ordinary skill will readily recognize). The receiver component may generate a detection signal in response to receipt at the antenna of the reflection of the electromagnetic energy transmission. As a result, a parameter associated with the object such as range (e.g., distance between the composite integrated circuit and the object) and speed may be determined by a processor based on the reference signal and the detection signal. The processor may also be integrated into the composite integrated circuit.

Figure 38:
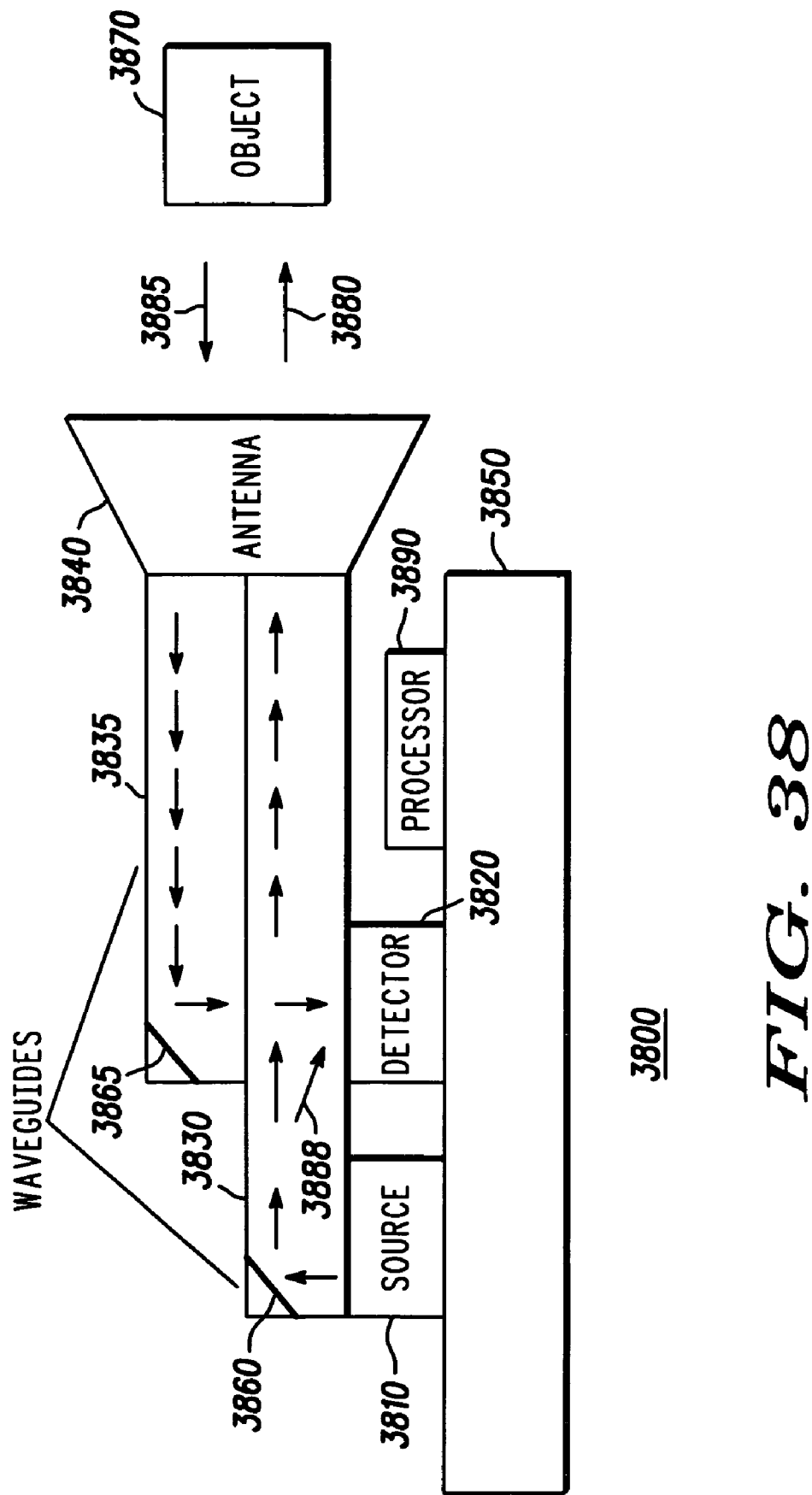
FIG. 38 illustrates schematically a semiconductor structure for detecting an object in accordance with what is shown herein.

Referring to FIG. 38, for example, a semiconductor structure 3800 for detecting an object generally includes an optical source component 3810, an optical detector component 3820, a first optical waveguide 3830, a second optical waveguide 3835, and an antenna 3840. The pair of optical components 3810, 3820 may be formed by processing steps conventionally used in the fabrication of gallium arsenide or other III–V compound semiconductor material devices. For example, the optical source component 3810 may be, but is not limited to, a vertical cavity surface emitting laser (VCSEL), a semiconductor laser (e.g., a gallium arsenide (GaAs) laser, an aluminum gallium arsenide (AlGaAs) laser, a gallium nitride (GaN) laser, an indium phosphide (InP) laser, and an indium gallium arsenide (InGasAs) laser), and a light emitting diode (LED). The optical detector component 3820 may be, but is not limited to, a photodetector (e.g., a photodiode and a heterojunction bipolar transistor (HBT)) and a photoelectric detector (e.g., gallium arsenide (GaAs) detector, an aluminum gallium arsenide (AlGaAs) detector, a gallium nitride (GaN) detector, an indium phosphide (InP) detector, and an indium gallium arsenide (InGaAs) detector). The pair of optical components 3810, 3820 is preferably integrated into a single integrated circuit 3850 having a single monocrystalline silicon substrate. For example, a semiconductor device 3800 for detecting an object includes a VCSEL and a photodetector that are formed within a monocrystalline compound semiconductor material on a common monocrystalline silicon substrate. Although the semiconductor structure 3800 for detecting an object has been described as a structure formed on a silicon substrate, other substrates, monocrystalline oxide layers and other compound semiconductor layers as described elsewhere in this disclosure may be used to fabricate the optical source component 3810 and the optical detector component 3820.

The pair of optical waveguides 3830, 3835 are preferably integrated into the single integrated circuit 3850. As illustrated in FIG. 38, the first optical waveguide 3830 is coupled between the optical source component 3810 and the antenna 3840, and the second optical waveguide 3835 is coupled with the optical detector component 3820. Furthermore, the second optical waveguide 3835 may be disposed to overlie the first optical waveguide 3830. The pair of optical waveguides 3830, 3835 may be formed as described elsewhere in this disclosure or by processing steps conventionally used in the fabrication of, for example, dielectric material (e.g., glass or plastic fiber) devices. In particular, the pair of optical waveguides 3830, 3835 may be formed from, for example, an organic material (e.g., an epoxy, a polycarbonate, a polystyrene, a polymethyl methacrylate, a polysulfone, a polyimide, and a polyurethane material), an inorganic material (e.g., a glass and a ceramic material such as a silica, a lithium niobate, a lead lanthamum, a zirconate titanate and a barium titanate (BTO)), and a gas medium. Each of the first and second optical waveguides 3830, 3835 generally includes a reflective component (two being shown as 3860, 3865). The reflective components 3860, 3865 are disposed to guide an electromagnetic energy transmission 3880 and a reflection 3885 of the electromagnetic energy transmission off of an object 3870, respectively. In particular, the reflective component 3860 is preferably integrated with the first optical waveguide 3830 to guide the electromagnetic energy transmission 3880 generated from the optical source component 3810 to the antenna 3840, and the reflective component 3865 is preferably integrated with the second optical waveguide 3835 to guide the reflection 3885 of the electromagnetic energy transmission off of the object 3870 from the antenna 3840 to the optical detector component 3820. In a dielectric waveguide, for example, the dielectric constant may be higher in the inside of the waveguide than that of the outside of the waveguide (e.g., air). Accordingly, the reflective components 3860, 3865 may be a media reflective surface formed at an angle such as 45 degrees to guide the electromagnetic energy transmission 3880 and its reflection 3885, respectively. The antenna 3840 is coupled with the pair of optical waveguides 3830, 3835. For example, the antenna 3850 may be, but is not limited to, a horn antenna.

In an alternate embodiment, the interconnect mentioned above may be adapted to detect an object via radio frequency and microwave. In particular, the interconnect may be a metallic waveguide. A probe (e.g., vertical rod) may be integrated with the metallic waveguide to guide an electromagnetic energy transmission from a source component to an antenna and a reflection of the electromagnetic energy transmission from the antenna to a receiver component. The probe may be insulated from the metallic waveguide and coupled to the source component. Further, the probe may be formed, for example, within a fraction of a wavelength from a back wall of the metallic waveguide as one of ordinary skill in art will readily recognize.

A basic flow for detecting an object 3870 (e.g., a person, a car, a plane, etc.) that may be applied with the preferred embodiment of the present invention shown in FIG. 38 starts with the optical source component 3810 generating an electromagnetic energy transmission 3880. The electromagnetic energy transmission 3880 may be, but is not limited to, an electromagnetic energy transmission in one of the radio, microwave, infrared, visible light and ultraviolet spectrums. The first optical waveguide 3830 guides the electromagnetic energy transmission 3880 via the reflective component 3860 to the antenna 3840. A portion 3888 of the electromagnetic energy transmission 3885 generated from the optical source component 3810 is guided to the optical detector component 3820 as a reference signal, which is further described below. The antenna 3840 transmits the electromagnetic energy transmission 3880. When there is no object 3870 then the electromagnetic energy transmission 3880, e.g., a visible light ray, is not reflected off of the object 3870 back to the antenna 3840. However, when there is an object 3870 then the antenna 3840 can receive a reflection 3885 of the electromagnetic energy transmission off of the object 3870. The second optical waveguide 3835 guides the reflection 3885 of the electromagnetic energy transmission via the reflective component 3865 to the optical detector component 3820, which in turn generates a detection signal to indicate a presence of an object. Furthermore, a processor 3890, which is preferably integrated into the single integrated circuit 3850, executes a program or a set of instructions such that the processor 3890 is operable to determine a parameter associated with the object 3870 based on the reference signal and the detection signal as one of ordinary skill in the art will readily recognize. The parameter associated with the object 3870 may be, for example, a direction, a distance, a height and a speed. For example, the processor 3890 may execute a program to determine the distance between the semiconductor structure 3800 and the object 3870 based on the reference signal and the detection signal, and a speed of the object 3870 based on the rate of change of the distance.

In an alternate embodiment, the semiconductor structure 3800 includes a plurality of receiver components and antennas as described in detail above to detect an object and to determine a direction of the object that is relative to the semiconductor structure 3800. A source component may generate a plurality of electromagnetic energy transmissions. The plurality of receiver components and antennas receives a plurality of reflections of the plurality of electromagnetic energy transmissions off of an object. Accordingly, the processor 3890 determines the direction of the object by using an amplitude and/or a phase difference-based angle of arrival estimation as one of ordinary skill in the art will readily recognize based on the plurality of reflections.

Figure 39:
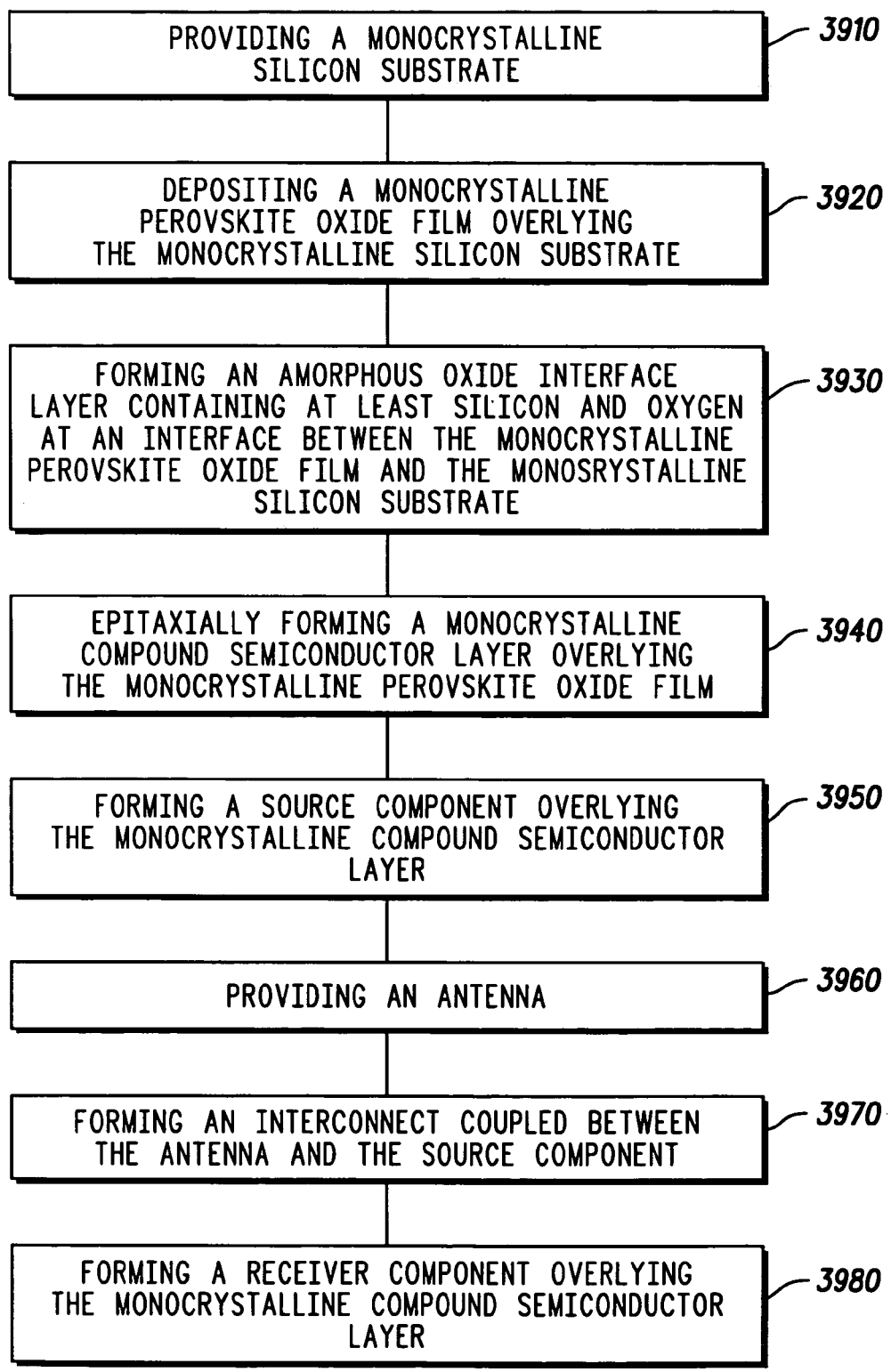
FIG. 39 illustrates a flow diagram of a method for detecting an object in accordance with what is shown herein.

Referring to FIG. 39, a method 3900 for detecting an object is illustrated. Method 3900 begins at step 3910, where a monocrystalline silicon substrate is provided. At step 3920, a monocrystalline perovskite oxide film is deposited to overlie the monocrystalline silicon substrate. The monocrystalline perovskite oxide film includes a thickness less than the material that would result in strain-induced defects. At step 3930, an amorphous oxide interface layer is formed at an interface between the monocrystalline perovskite oxide film and the monocrystalline silicon substrate. The amorphous oxide interface layer contains at least silicon and oxygen. At step 3940, a monocrystalline compound semiconductor layer is epitaxially formed to overlie the monocrystalline perovskite oxide film. At step 3950, a source component is formed to overlie the monocrystalline compound semiconductor layer. The source component, for example an optical source or radio tranmistter, generates an electromagnetic energy transmission. At step 3960, an antenna is provided to transmit the electromagnetic energy transmission generated by the source component. The antenna may receive a reflection of the electromagnetic energy transmission off of an object. At step 3970, an interconnect is formed to couple between the antenna and the source component. The interconnect may comprise a single interconnect (e.g., a single optical waveguide) or a plurality of interconnects to guide the electromagnetic energy transmission from the source component to the antenna. Further, the interconnect may guide a portion of the electromagnetic energy transmission from the source component to a receiver component, such as an optical detector or radio receiver, as a reference signal. At step 3980, the receiver component is formed to overlie the monocrystalline compound semiconductor layer. The interconnect guides the reflection of the electromagnetic energy transmission off of the object to the receiver component, which may be an optical detector component. Accordingly, the receiver component generates a detection signal in response to receipt at the antenna of the reflection of the electromagnetic energy transmission off of the object. The detection signal indicates a presence of the object. Furthermore, the reference signal and the detection signal may be used to determine a parameter associated with the object.

Devices constructed in accordance with the foregoing described preferred embodiments of the invention may be used for detecting an object. For example, a source component generates an electromagnetic energy transmission. An interconnect guides the electromagnetic energy transmission to an antenna, which in turn, transmits the electromagnetic energy transmission. The interconnect may guide a portion of the electromagnetic energy transmission from the source component to a receiver component as a reference signal. The antenna receives a reflection of the electromagnetic energy transmission off of an object. In response to receipt at the antenna of the reflection of the electromagnetic energy transmission off of the object, the receiver component generates a detection signal that indicates a presence of the object. The reference signal and the detection signal may be used to determine a parameter associated with the object such as a direction, a distance, a height and a speed of the object.

A composite integrated circuit such as the semiconductor structure 3800 may include processing circuitry that is formed at least partly in the Group IV semiconductor portion of the composite integrated circuit but may be formed using one of the formation techniques and materials herein described. The processing circuitry is configured to communicate with circuitry external to the composite integrated circuit. The processing circuitry may be electronic circuitry, such as a microprocessor, RAM, logic device, decoder, etc.

For the processing circuitry to communicate with external electronic circuitry, the composite integrated circuit may be provided with electrical signal connections with the external electronic circuitry. The composite integrated circuit such as the semiconductor structure 3800 may have internal optical communications connections for connecting the processing circuitry in the composite integrated circuit to the electrical connections with the external circuitry. Optical components in the composite integrated circuit may provide the optical communications connections which may electrically isolate the electrical signals in the communications connections from the processing circuitry. Together, the electrical and optical communications connections may be for communicating information, such as data, control, timing, etc.

A pair of optical components (an optical source component and an optical detector component) in the composite integrated circuit may be configured to pass information. Information that is received or transmitted between the optical pair may be from or for the electrical communications connection between the external circuitry and the composite integrated circuit. The optical components and the electrical communications connection may form a communications connection between the processing circuitry and the external circuitry while providing electrical isolation for the processing circuitry. If desired, a plurality of optical component pairs may be included in the composite integrated circuit for providing a plurality of communications connections and for providing isolation. For example, a composite integrated circuit receiving a plurality of data bits may include a pair of optical components for communication of each data bit.

In operation, for example, an optical source component in a pair of components may be configured to generate light (e.g., photons) based on receiving electrical signals from an electrical signal connection with the external circuitry. An optical detector component in the pair of components may be optically connected to the source component to generate electrical signals based on detecting light generated by the optical source component. Information that is communicated between the source and detector components may be digital or analog.

If desired the reverse of this configuration may be used. An optical source component that is responsive to the on-board processing circuitry may be coupled to an optical detector component to have the optical source component generate an electrical signal for use in communications with external circuitry. A plurality of such optical component pair structures may be used for providing two-way connections. In some applications where synchronization is desired, a first pair of optical components may be coupled to provide data communications and a second pair may be coupled for communicating synchronization information.

For clarity and brevity, optical detector components that are discussed below are discussed primarily in the context of optical detector components that have been formed in a compound semiconductor portion of a composite integrated circuit. In application, the optical detector component may be formed in many suitable ways (e.g., formed from silicon, etc.).

A composite integrated circuit will typically have an electric connection for a power supply and a ground connection. The power and ground connections are in addition to the communications connections that are discussed above. Processing circuitry in a composite integrated circuit may include electrically isolated communications connections and include electrical connections for power and ground. In most known applications, power supply and ground connections are usually well-protected by circuitry to prevent harmful external signals from reaching the composite integrated circuit. A communications ground may be isolated from the ground signal in communications connections that use a ground communications signal.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A semiconductor structure comprising:
a monocrystalline compound semiconductor material;
a source component overlying the monocrystalline compound semiconductor material, the source component being operable to generate electromagnetic energy;
first interconnect coupled between the antenna and the source component, the first interconnect being operable to guide a first portion of the electromagnetic energy from the source component to an antenna that transmits the first portion of the electromagnetic energy;
a receiver component overlying the monocrystalline compound semiconductor material; and
a second interconnect coupled between the antenna and the receiver component,
wherein the first interconnect is further coupled between the source component and the receiver component and operable to guide a second portion of the electromagnetic energy from the source component to the receiver component, the second portion being operable as a reference signal, and wherein the receiver component is operable to generate a detection signal in response to a reflection of the first portion of the electromagnetic energy received at the antenna from an object that is external to the semiconductor structure, the first portion of electromagnetic energy being coupled to the receive component by the second interconnect.

2. The semiconductor structure of claim 1, wherein the source component is one of a radio frequency (RE) transmitter and an optical source component.

3. The semiconductor structure of claim 2, wherein the source component is one of a vertical cavity surface emitting laser (VCSEL), a group III–V compound semiconductor laser, and a light emitting diode (LED).

4. The semiconductor structure of claim 3, wherein the group III–V compound semiconductor laser is one of a gallium arsenide (GaAs) laser, an aluminum gallium arsenide (AIGaAs) laser, a gallium nitride (GaN) laser, an indium phosphide (InP) laser, and an indium gallium arsenide (InGasAs) laser.

5. The semiconductor structure of claim 1, wherein the receiver component is one of a radio frequency (RF) receiver and an optical detector component.

6. The semiconductor structure of claim 5, wherein the optical detector component is one of a photodetector and a photoelectric detector.

7. The semiconductor structure of claim 6, wherein the photodetector is one of a photodiode and a phototransistor.

8. The semiconductor structure of claim 7, wherein the photoelectric detector is a group III–V compound semiconductor detector.

9. The semiconductor structure of claim 8, wherein the group III–V compound semiconductor detector is one of a gallium arsenide (GaAs) detector, an aluminum gallium arsenide (AIGaAs) detector, a gallium nitride (GaN) detector, an indium phosphide (InP) detector, and an indium gallium arsenide (InGaAs) detector.

10. The semiconductor structure of claim 1, wherein the first and second interconnects are one of optical waveguides and a metallic waveguides.

11. The semiconductor structure of claim 10, wherein the optical waveguides are formed from one of an organic material, an inorganic material, and a gas medium.

12. The semiconductor structure of claim 11, wherein the organic material is one of an epoxy, a polycarbonate, a polystyrene, a polymethyl methacrylate, a polysulfone, a polyimide, and a polyurethane material.

13. The semiconductor structure of claim 11, wherein the organic material is one of a glass and a ceramic material.

14. The semiconductor structure of claim 13, wherein the ceramic material is one of a silica, a lithium niobate, a lead lanthamum, a zirconate titanate and a barium titanate (BTO) material.

15. The semiconductor structure of claim 1, wherein the first and second interconnects each comprise a reflective component, the reflective component being operable to guide the electromagnetic energy.

16. The semiconductor structure of claim 1, wherein the antenna is a horn antenna.

17. The semiconductor structure of claim 1 further comprising a processor overlying the monocrystalline compound semiconductor material and coupled to the receiving component, wherein the processor is operable to determine a parameter associated with the object based on the reference signal received by the receiving component and the detection signal generated by the receiving component, wherein the parameter is one of a direction, a distance, a height, and a speed.

18. The semiconductor structure of claim 1, wherein the electromagnetic energy in one of the radio, microwave, infrared, visible light and ultraviolet spectrums.

* * * * *